(12) United States Patent
Ohsawa

(10) Patent No.: US 7,660,165 B2
(45) Date of Patent: Feb. 9, 2010

(54) MEMORY DEVICE AND SEMICONDUCTOR DEVICE

(75) Inventor: Nobuharu Ohsawa, Zama (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 558 days.

(21) Appl. No.: 11/410,087

(22) Filed: Apr. 25, 2006

(65) Prior Publication Data

US 2006/0246643 A1    Nov. 2, 2006

(30) Foreign Application Priority Data

Apr. 28, 2005    (JP)    ............... 2005-132816

(51) Int. Cl.
G11C 11/03    (2006.01)
G11C 16/00    (2006.01)

(52) U.S. Cl. ............... 365/185.26; 365/185.07; 365/185.23; 365/185.27

(58) Field of Classification Search ............ 365/185.26, 365/185.27, 185.07, 185.23
See application file for complete search history.

(56) References Cited

U.S. PATENT DOCUMENTS

| | | | |
|---|---|---|---|
| 4,954,985 A | 9/1990 | Yamazaki | |
| 6,528,815 B1 | 3/2003 | Brown et al. | |
| 6,723,396 B1 | 4/2004 | Patrick | |
| 6,751,133 B2 | 6/2004 | Kurosaki | |
| 6,858,270 B2 | 2/2005 | Patrick | |
| 6,950,331 B2* | 9/2005 | Yang et al. | ............ 365/148 |
| 6,977,389 B2* | 12/2005 | Tripsas et al. | ............ 257/40 |
| 2004/0027849 A1 | 2/2004 | Yang et al. | |
| 2004/0155244 A1* | 8/2004 | Kawata et al. | ............ 257/59 |
| 2007/0153565 A1 | 7/2007 | Nomura et al. | |
| 2007/0166924 A1* | 7/2007 | Kund et al. | ............ 438/266 |
| 2007/0285959 A1 | 12/2007 | Yamazaki | |
| 2008/0123396 A1 | 5/2008 | Kato et al. | |

FOREIGN PATENT DOCUMENTS

| | | |
|---|---|---|
| CN | 1239329 | 12/1999 |
| CN | 1412778 | 4/2003 |
| EP | 1 298 673 | 4/2003 |
| JP | 2002-026277 | 1/2002 |
| JP | 2004-006271 | 1/2004 |
| JP | 2004-179249 | 6/2004 |
| WO | WO 2005/096380 | 10/2005 |

OTHER PUBLICATIONS

Moller.S et al., "A Polymer/Semiconductor Write-Once Read-Many-Times Memory,", Nature, Nov. 13, 2003, vol. 426, pp. 166-169.
Office Action (Application No. 200610079907.7) dated Apr. 24, 2009.

* cited by examiner

Primary Examiner—Pho M. Luu
(74) Attorney, Agent, or Firm—Eric J. Robinson; Robinson Intellectual Property Law Office, P.C.

(57) ABSTRACT

A memory device has a pair of conductive layers and an organic compound having a liquid crystal property that is interposed between the pair of conductive layers. Data is recorded in the memory device by applying a first voltage to the pair of conductive layers and heating the organic compound, to cause a phase change of the organic compound from a first phase to a second phase.

55 Claims, 17 Drawing Sheets

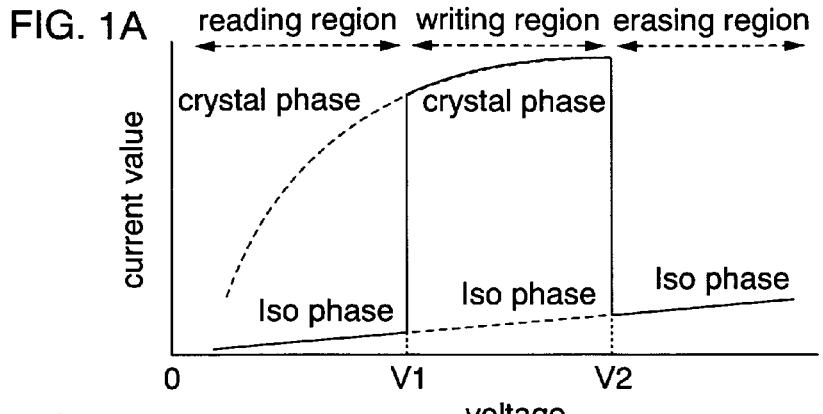

FIG. 1A

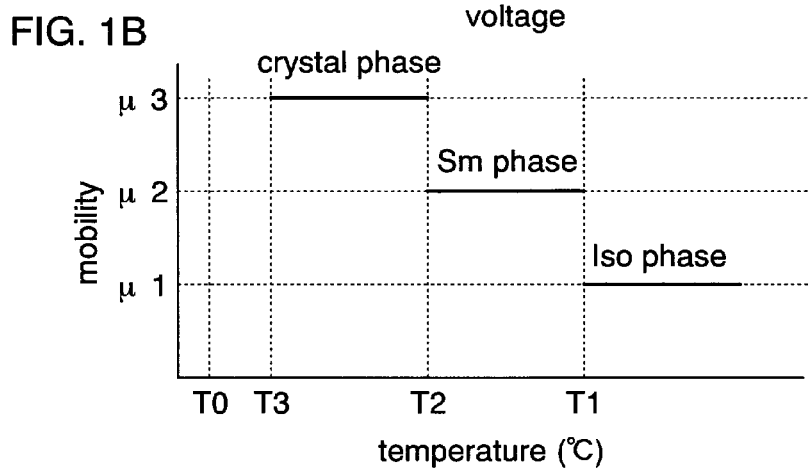

FIG. 1B

FIG. 1C first phase change
Iso phase ⇄ crystal phase
second phase change

FIG. 1D third phase change
Iso phase ⇄ Sm phase
fourth phase change

FIG. 1E fifth phase change
Sm phase ⇄ crystal phase
sixth phase change

FIG. 1F seventh phase change
crystal phase ⇄ Sm phase
eighth phase change

FIG. 1G ninth phase change
crystal phase ⇄ Iso phase
tenth phase change

FIG. 1H eleventh phase change
Sm phase ⇄ Iso phase
twelfth phase change

MEMORY DEVICE AND SEMICONDUCTOR DEVICE

BACKGROUND OF THE INVENTION

1. Field of the Invention

The present invention relates to a memory device and a semiconductor device equipped with the memory device.

2. Description of the Related Art

In recent years, a semiconductor device having a plurality of circuits integrated over an insulated surface and various functions has been developed. Further, development of a semiconductor device capable of wireless data transmission/reception by providing an antenna has been advanced. Such a semiconductor device is referred to as a wireless chip (also referred to as an ID tag, an IC tag, an IC chip, an RF (Radio Frequency) tag, a wireless tag, an electronic tag, or an RFID (Radio Frequency Identification) tag), and is already introduced to a part of the market.

Many of these semiconductor devices that have already been put into practical use include a circuit using a semiconductor substrate such as a Si substrate (also referred to as an IC (Integrated Circuit) chip) and an antenna, and the IC chip includes a memory circuit (also referred to as a memory), a control circuit and the like. In particular, by providing a memory circuit which can store much data, a high-value-added semiconductor device providing higher performance can be provided. In addition, there are demands that such semiconductor devices be manufactured at low cost, and in recent years, an organic TFT, an organic memory and the like using an organic compound for a control circuit, a memory circuit and the like have been actively developed (Reference 1: Japanese Patent Application Laid-Open No. 2002-26277).

SUMMARY OF THE INVENTION

As a memory circuit, a DRAM (Dynamic Random Access Memory), an SRAM (Static Random Access Memory), an FeRAM (Ferroelectric Random Access Memory), a mask ROM (Read Only Memory), an EPROM (Electrically Programmable Read Only Memory), an EEPROM (Electrically Erasable and Programmable Read Only Memory), a flash memory and the like are given. Among them, a DRAM and an SRAM are volatile memory circuits in which data is erased when the power is turned off and it is necessary to write data every time the power is turned on. An FeRAM is an involatile memory circuit; however, since it uses a capacitor element including a ferroelectric layer manufacturing steps thereof are increased. A mask ROM has a simple structure; however, data is required to be written during the manufacturing steps and cannot be additionally written. An EPROM, an EEPROM, and a flash memory are involatile memory circuits; however, an element having two gate electrodes is used, and thus, the manufacturing steps are increased.

In view of the foregoing problem, an object of the present invention is to provide an involatile memory device that is capable of writing and erasing data at a time other than during manufacturing, and a semiconductor having the memory device. Also, an object of the present invention is to provide a compact-sized and inexpensive involatile memory device and a semiconductor device having the memory device.

One feature of the present invention is a memory device including a pair of conductive layers and an organic compound having a liquid crystal property that is interposed between the pair of conductive layers, wherein data is recorded in the memory device by applying a first voltage to the pair of conductive layers and heating the organic compound, to cause a phase change of the organic compound from a first phase to a second phase.

One feature of the present invention is a memory device including a memory cell array in which memory elements are arranged in a matrix form, and a writing circuit. The memory element includes a pair of conductive layers and an organic compound having a liquid crystal property interposed between the pair of electrodes. The memory device records data by applying a first voltage to the pair of conductive layers and heating the organic compound, to cause a phase change of the organic compound from a first phase to a second phase.

One feature of the present invention is a memory device including a memory cell array in which memory cells are arranged in a matrix form, and a writing circuit. The memory cell includes a transistor and a memory element, and the memory element has a pair of conductive layers and an organic compound having a liquid crystal property interposed between the pair of conductive layers. The memory device records data by applying a first voltage to the pair of conductive layers and heating the organic compound, to cause a phase change of the organic compound from a first phase to a second phase.

One feature of the present invention is a memory device including a memory cell array in which memory elements are arranged in a matrix form, a writing circuit, and an erasing circuit. The memory element includes a pair of conductive layers and an organic compound having a liquid crystal property interposed between the pair of conductive layers. The memory device records data by applying a first voltage to the pair of conductive layers and heating the organic compound to cause a phase change of the organic compound from a first phase to a second phase, and the memory device erases data by applying a second voltage to the pair of conductive layers and heating the organic compound to cause a phase change of the organic compound from the second phase to the first phase.

One feature of the present invention is a memory device including a memory cell array in which memory cells are arranged in a matrix form, a writing circuit, and an erasing circuit. The memory cell has a transistor and a memory element, and the memory element includes a pair of conductive layers and an organic compound having a liquid crystal property interposed between the pair of conductive layers. The memory device records data by applying a first voltage to the pair of conductive layers and heating the organic compound to cause a phase change of the organic compound from a first phase to a second phase, and the memory device erases data by applying a second voltage to the pair of conductive layers and heating the organic compound to cause a phase change of the organic compound from the second phase to the first phase.

The organic compound is in an isotropic phase while in a first temperature range, in a smectic phase while in a second temperature range, and in a crystal phase while in a third temperature range. The first temperature range is higher than the second temperature range, and the second temperature range is higher than the third temperature range.

Note that when applying the first voltage to the pair of conductive layers after heating the organic compound to be in the first phase and then rapidly cooling the organic compound, the first phase is an isotropic phase and the second phase is a smectic phase. Alternatively, the first phase is an isotropic phase and the second phase is a crystal phase. Further alternatively, the first phase is a smectic phase and the second phase is a crystal phase.

One feature of the present invention is a memory device including a memory cell array in which memory elements are arranged in a matrix form, a writing circuit, and an erasing circuit. The memory element includes a pair of conductive layers and an organic compound having a liquid crystal property interposed between the pair of conductive layers. The memory device records data by applying a first voltage to the pair of conductive layers and heating the organic compound to cause a phase change of the organic compound from a first phase to a second phase, and data is erased by heating the organic compound then stopping the heating and cooling the organic compound to cause a phase change from the second phase to the first phase.

One feature of the present invention is a memory device including a memory cell array in which memory cells are arranged in a matrix form, a writing circuit, and an erasing circuit. The memory cell includes a transistor and a memory element, and the memory element has a pair of conductive layers and an organic compound having a liquid crystal property interposed between the pair of conductive layers. The memory device records data by applying a first voltage to the pair of conductive layers and heating the organic compound to cause a phase change of the organic compound from a first phase to a second phase, and data is erased by heating the organic compound then stopping the heating and cooling the organic compound to cause a phase change from the second phase to the first phase.

Note that the first phase is a crystal phase, and the second phase is a smectic phase. Also, the first phase is a crystal phase, and the second phase is an isotropic phase. Further, the first phase is a smectic phase, and the second phase is an isotropic phase.

One feature of the present invention is a semiconductor device that has the foregoing memory element, a conductive layer functioning as an antenna, a first transistor connected to a first conductive layer or a second conductive layer of the memory element, and a second transistor connected to the conductive layer functioning as an antenna.

The organic compound of the aforementioned memory element is formed with an organic semiconductor showing a liquid crystal property during heating. General formulas (1) to (13) are given as typical examples of the organic semiconductor showing a liquid crystal property.

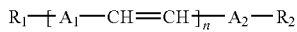 (1)

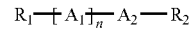 (2)

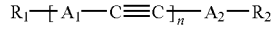 (3)

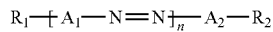 (4)

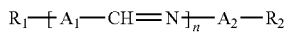 (5)

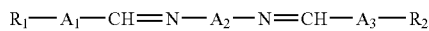 (6)

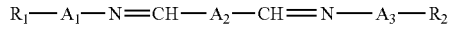 (7)

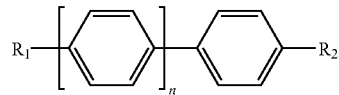 (8)

 (9)

-continued

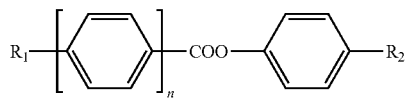 (10)

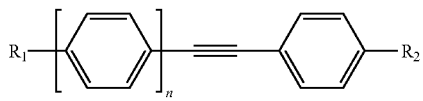 (11)

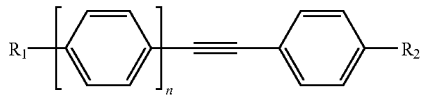 (12)

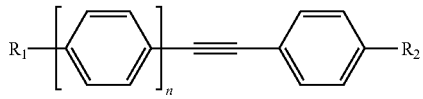 (13)

In the general formulas (1) to (13), m and n each represents an integer of 0 to 5. Further, $R_1$ or $R_2$ represents an alkyl group, an alkoxy group, a phenyl group, a cyclohexyl group, a cyano group, a fluoro group, or the general formula (14) below (wherein $R_3$ is a hydrogen atom or a methyl group, and B is $-(CH_2)_1-$, $-(CH_2)_1-O-$, $-CO-O-(CH_2)_1-$, $-CO-O-(CH_2)_1-O-$, $C_6H_{14}-CH_2-O-$, or $-CO-$), that are straight-chain or branched.

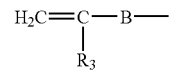 (14)

Note that $R_1$ or $R_2$ may be the same group, or different groups. Also, 1 in B represents an integer of 0 to 5. Further, $A_1$ to $A_3$ indicate any one of or a plurality of the general formulas (15) to (24) below. Note that $A_1$ to $A_3$ may be the same group, or different groups.

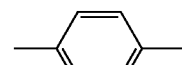 (15)

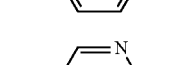 (16)

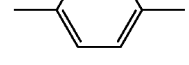 (17)

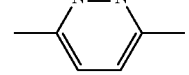 (18)

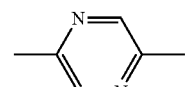 (19)

-continued

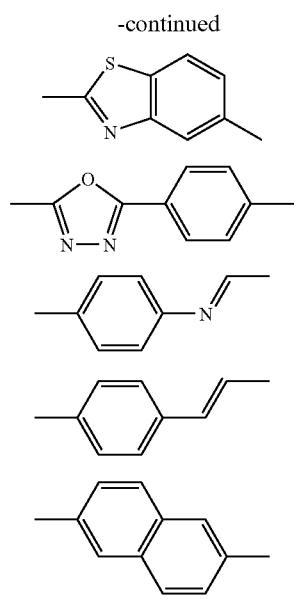

A memory device of the present invention is capable of selectively recording and erasing data by applying voltage to a pair of conductive layers. Therefore, it is possible to write and erase data at a time other than during manufacturing by selectively heating an arbitrary memory element. Also, since there is no need to provide a separate device for writing and erasing data, the memory device can be downsized and simplified. Further, by using the present invention, a compact-sized semiconductor device can be manufactured inexpensively.

BRIEF DESCRIPTION OF DRAWINGS

In the accompanying drawings:

FIGS. 1A to 1H describe a reading operation, a writing operation, and an erasing operation of a memory device of the present invention.

DETAILED DESCRIPTION OF THE INVENTION

Embodiment Mode

Figure 2A:
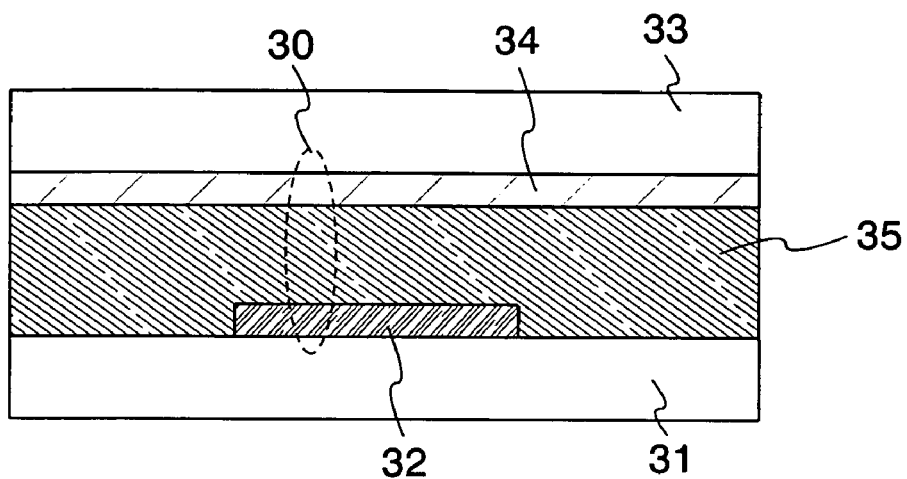
FIGS. 2A and 2B are each cross sectional views describing a memory element of the present invention.

Embodiment modes of the present invention will hereinafter be described based on the accompanying drawings. However, the present invention can be carried out in many different modes, and it is easily understood by those skilled in the art that modes and details herein disclosed can be modified in various ways without departing from the spirit and the scope of the present invention. Therefore, the present invention should not be interpreted as being limited to the description of the embodiment modes to be given below. Note that in all drawings for describing the embodiment modes, the same reference numerals are used for the same portions or the portions having similar functions, and the repeated description thereof is omitted.

Embodiment Mode 1

In this embodiment mode, one structural example of a memory element included in a memory device of the present invention is described with reference to drawings.

FIGS. 1A to 1H show operation methods of data reading, writing, and erasing of a memory element included in a memory device of the present invention. FIGS. 2A to 4D each show cross sectional structures of the memory elements included in the memory devices of the present invention.

Figure 2B:
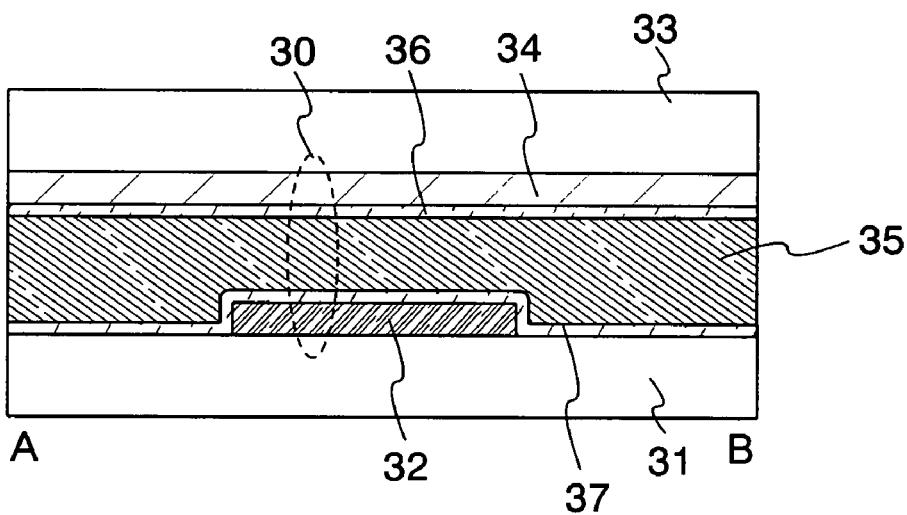

As shown in FIG. 2A, a memory element 30 includes a first conductive layer 32 formed over a first substrate 31, a second conductive layer 34 formed adjacently to a second substrate 33, and an organic compound layer 35 interposed between the first substrate 31 and the first conductive layer 32, and the second substrate 33 and the second conductive layer 34. Also, as shown in FIG. 2B, a surface of the first substrate 31 and the first conductive layer 32, and a surface of the second substrate 33 and the second conductive layer 34 may each be provided with an orientation film 36 or 37 for orienting an organic compound layer. By providing orientation films 36 and 37, phase change of the organic compound layer can be carried out easily.

The memory element of the present invention carries out data recording, reading, and erasing by a change in the mobility of the organic compound layer caused by a phase change of the organic compound layer. An organic semiconductor having a liquid crystal property that changes phases by temperature is used for the organic compound layer 35. An organic semiconductor that is a smectic liquid crystal having a smectic phase is particularly preferable. For this reason, as shown in FIG. 1B, a phase change occurs depending on the temperature and a different phase is exhibited when T1>T2>T3>T0, as in the following: the organic compound layer 35 is in an isotropic phase (hereinafter referred to as an Iso phase) at or over T1; a smectic phase (hereinafter referred to as an Sm phase) at or over T2 and under T1; and a crystal phase at or over T3 and under T2. Further, the Sm phase may have a plurality of Sm phases such as an SmA phase, an SmB phase, an SmC phase, an SmD phase, an SmE phase, an SmF phase, an SmG phase, and an SmH phase.

Since the organic compound layer of the memory element of the present invention is formed of an organic semiconductor, the mobility is μ1 in the Iso phase, μ2 in the Sm phase, and μ3 in the crystal phase. The crystal phase has a high mobility because it has high crystallinity, and the Iso phase has a low mobility because molecules are isotropic. Therefore, μ1<μ2<μ3.

When the Sm phase has a plurality of phases of SmA phase to SmH phase, each has a different mobility.

Figure 3A:
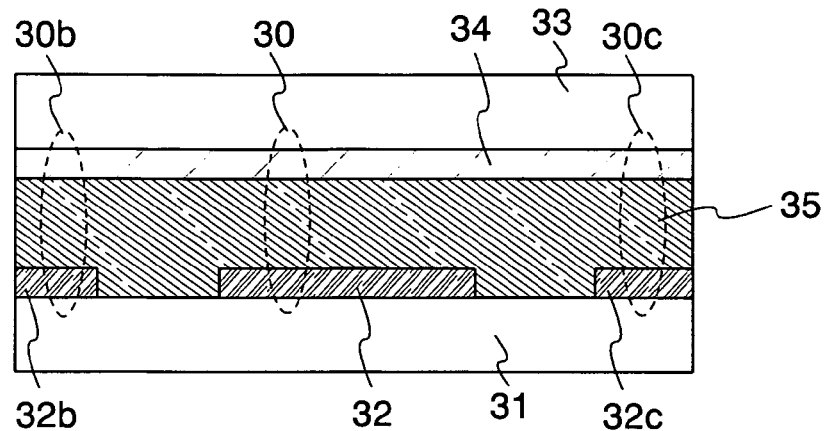
FIGS. 3A to 3C are each cross sectional views describing a memory element of the present invention.
Figure 3B:
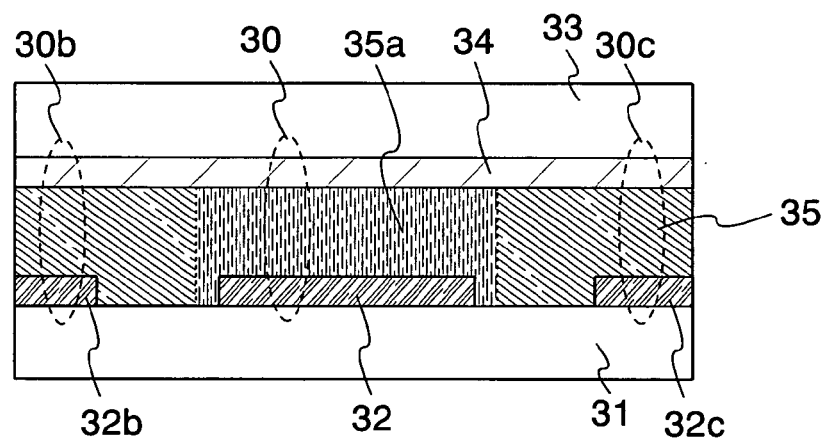
Figure 3C:
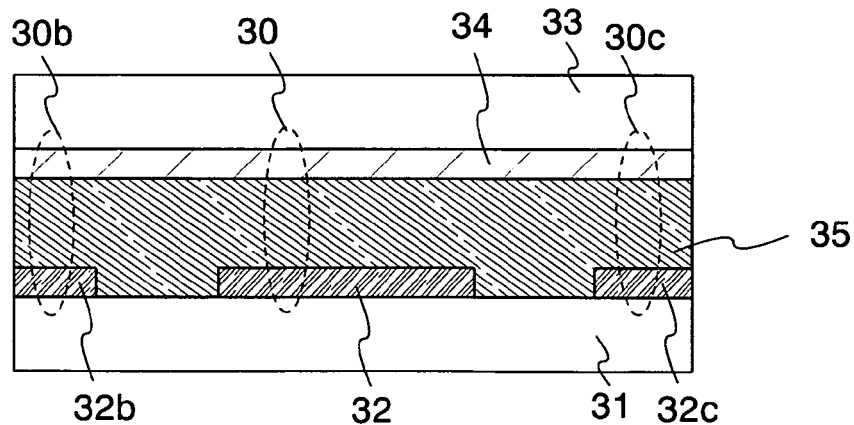

An operation during data writing is described with reference to FIGS. 1A to 3C. Note that the operation during data writing in FIGS. 1C to 1E is a case where data is written by changing phases of an organic compound layer with a low mobility to an organic compound with a high mobility. Such writing operation will hereinafter be referred to as a first writing operation. Also, a right arrow indicates writing and a left arrow indicates erasing. Further, FIGS. 3A to 3C show a memory element 30 formed with a first conductive layer 32, an organic compound layer 35, and a second conductive layer 34. A memory element 30b formed with a first conductive layer 32b, the organic compound layer 35, and the second conductive layer 34 is also shown. Furthermore, a memory element 30c formed with a first conductive layer 32c, the organic compound layer 35, and the second conductive layer 34 is shown.

A case of carrying out the first writing operation that utilizes a phase change from the Iso phase (mobility μ1) to the crystal phase (mobility μ3) as shown in FIG. 1C will be described. After applying a voltage of V2 or higher to the first conductive layer 32 and the second conductive layer 34 of a memory element for which writing is to be carried out, in order to generate Joule heat for heating the organic compound layer 35 to T1 or over so that it is in the Iso phase, the organic compound layer 35 is rapidly cooled to T0. At this time, the organic compound layer is in the Iso phase, and the mobility is μ1. In addition, V2 is an erasing voltage (see FIG. 3A).

It is to be noted that here, the organic compound layer 35 can remain in the Iso phase by heating the organic compound layer 35 to T1 or over to be in the Iso phase, and then rapidly cooling the organic compound layer 35 to T0. As a cooling means for rapidly cooling the memory element, a cooling liquid or a cooling gas may be used. As the cooling liquid, liquid nitrogen or the like may be used, and as the cooling gas, a noble gas or the like may by used.

A voltage of V1 or over and under V2 is applied to the first conductive layer 32 and the second conductive layer 34 to generate Joule heat, so that an organic compound layer 35a is at T3 or over and under T2. Note that V1 is a writing voltage. As a result, a first phase change occurs and the organic compound layer 35a is in a crystal phase, and the mobility of the organic compound layer 35a changes to μ3 (see FIGS. 1C and 3B). Compared to the other memory elements 30b and 30c, the memory element 30 for which the organic compound layer 35a has been changed from the Iso phase to the crystal phase, has an electrical resistance which is significantly smaller and a current value which is larger. In this manner, data writing is carried out by applying voltage to the pair of conductive layers, and utilizing changes in electrical resistance and current value of the memory element.

A first reading operation is described with reference to FIG. 1C. A voltage under V1 is applied to the first conductive layers 32, 32b, and 32c, as well as the second conductive layer 34, so that a current flows in the memory elements 30, 30b, and 30c. At this time, data reading is carried out with the current value and the electrical resistance of each of the memory elements. For example, organic compound layers of the memory elements 30b and 30c for which writing is not carried out are in the Iso phase. For this reason, the mobility of the organic compound layer 35 is low, and the electrical resistance is high and the current value is low for the memory elements 30b and 30c. Such elements as the memory elements 30b and 30c have data "0." On the other hand, writing is carried out for the memory element 30, and the mobility of the organic compound layer 35a is high because the organic compound layer 35a is in the crystal phase, and the electrical resistance is low and the current value is high for the memory element 30. Such element as the memory element 30 has data "1." Data reading is carried out by electrically reading disparities in electrical resistance and current value between the memory elements in this manner.

A first erasing operation is described with reference to FIG. 1C. A voltage of V2 or over is applied to the first conductive layer 32 and the second conductive layer 34 of the memory element 30 for which writing has been carried out, and the organic compound layer 35a is heated to T1 or over by Joule heat that is generated. As a result, a second phase change occurs and the organic compound layer is in the Iso phase. Subsequently, the organic compound layer is rapidly cooled to T0 (see FIG. 3C). As a result, the mobility of the organic compound layer of the memory element 30 is μ1 and data can be erased.

It is to be noted that here, the organic compound layer 35a can remain in the Iso phase by heating the organic compound 35a to T1 or over to be in the Iso phase, and then rapidly cooling it.

Writing may be carried out by utilizing a phase change from the Iso phase (mobility μ1) to the Sm phase (mobility μ2) as shown in FIG. 1D. The organic compound layer 35 is in the Iso phase, similarly to the aforementioned first writing operation. Subsequently, a voltage of the writing voltage V1 or over and under the erasing voltage V2 is applied to the first conductive layer 32 and the second conductive layer 34 of a selected memory element to generate Joule heat, so that the organic compound layer 35a is at T2 or over and under T1. As a result, a third phase change occurs and the organic compound layer 35a is in the Sm phase, and the mobility of the organic compound layer 35a changes to μ2. For the memory element in which the organic compound layer 35a has been changed from the Iso phase to the Sm phase, the electrical resistance becomes significantly small, and the current value becomes large. In this manner, data writing is carried out by applying voltage to the pair of conductive layers, and utilizing changes in electrical resistance and current value of the memory element.

A reading operation is described with reference to FIG. 1D. A voltage of under the writing voltage V1 is applied to the first conductive layer 32 and the second conductive layer 34 to feed a current to the memory element 30. At this time, data is read by electrically reading differences in current value and electrical resistance of the memory element, before and after voltage is applied to feed a current.

An erasing operation is described with reference to FIG. 1D. A voltage of the erasing voltage V2 or over is applied to the first conductive layer 32 and the second conductive layer 34 for which writing has been carried out, to generate Joule heat for heating the organic compound layer 35a to T1 or over. As a result, a fourth phase change occurs and the organic compound layer 35a is in the Iso phase. Subsequently, the organic compound layer 35a is rapidly cooled to T0 so that it is fixed in the Iso phase. As a result, the mobility of the organic compound layer becomes μ1, and data can be erased.

Also, as shown in FIG. 1E, writing may be carried out by utilizing a phase change from the Sm phase (mobility $\mu 2$) to the crystal phase (mobility $\mu 3$). In a similar manner to the aforementioned first writing operation, voltage is applied to the first conductive layer 32 and the second conductive layer 34 of all of the memory elements to generate Joule heat in order to heat the organic compound layer 35 to T2 or over and under T1, to be in the Sm phase. Then, the organic compound layer 35 is rapidly cooled to T0 so that it is fixed in the Sm phase. At this time, the organic compound layer 35 is in the Sm phase, and the mobility is $\mu 2$. Subsequently, voltage is applied to the first conductive layer 32 and the second conductive layer 34 of a selected memory element, to generate Joule heat for heating the organic compound layer 35a to T3 or over and under T2. As a result, a fifth phase change occurs and the organic compound layer 35a is in a crystal phase, and the mobility changes to $\mu 3$. For the memory element in which the organic compound layer 35a has been changed from the Sm phase to the crystal phase, the electrical resistance becomes significantly small, and the current value becomes large. In this manner, data writing is carried out by applying voltage to the pair of conductive layers, and utilizing changes in electrical resistance and current value of the memory element.

A reading operation is described with reference to FIG. 1E. A voltage under the writing voltage V1 is applied to the first conductive layer 32 and the second conductive layer 34 to feed a current to the memory element 30. Data reading is carried out by the resistance value and the current value at this time.

An erasing operation is described with reference to FIG. 1E. A voltage of the erasing voltage of V2 or over is applied to the first conductive layer 32 and the second conductive layer 34 of a memory element for which writing has been carried out, to generate Joule heat for heating the organic compound layer 35a to T2 or over and under T1. As a result, a sixth phase change occurs and the organic compound layer is in the Sm phase (see FIG. 1E). Subsequently, the organic compound layer is rapidly cooled to T0 so that it is fixed in the Sm phase. As a result, the mobility of the memory element 30 is $\mu 2$, and data can be erased.

A second writing operation that is different from the first writing operation is described with reference to FIGS. 1B, and 1F to 1H. Note that FIGS. 1F to 1H show a case where data is written by a phase change of an organic compound layer with a high mobility, to an organic compound layer with a low mobility. Also, a right arrow indicates writing and a left arrow indicates erasing.

As shown in FIG. 1F, a case of carrying out writing by utilizing a phase change from the crystal phase (mobility $\mu 3$) to the Sm phase (mobility $\mu 2$) is described. Voltage is applied to the first conductive layer 32 and the second conductive layer 34 of a selected memory element to feed a current, and after the organic compound layer 35 that is in a crystal phase is heated to T2 or over and under T1, it is rapidly cooled to be fixed in the Sm phase. As a result, a seventh phase change occurs and the organic compound layer 35a is in the Sm phase, and the mobility changes to $\mu 2$. In other words, compared to a memory element for which writing has not been carried out, the electrical resistance is increased and the current value is reduced for a memory element for which writing is carried out. In this manner, data writing is carried out by applying voltage to the pair of conductive layers, and utilizing changes in electrical resistance and current value of the memory element.

A reading operation is described with reference to FIG. 1E A voltage of under the writing voltage V1 is applied to the first conductive layer 32 and the second conductive layer 34 to feed a current to the memory element 30. Data reading is carried out by electrically reading disparities in current value and electrical resistance at this time between the memory element and other memory elements.

A second erasing operation that is different from the first erasing operation is described with reference to FIG. 1F. In the second erasing operation, after heating the organic compound layer 35a that is in the Sm phase, which is in a memory element for which writing has been carried out, to T2 or over and under T1 and heightening a fluid property of the organic compound layer 35a, it is slowly cooled to T3 or over and under T2 to be fixed in the crystal phase. Specifically, heating of the memory element is stopped and the organic compound layer 35a is cooled, so that the organic compound layer 35a changes from the Sm phase to the crystal phase. As a result, an eighth phase change occurs and the organic compound layer 35 is in the crystal phase, and the mobility of the memory element 30 is $\mu 3$. In other words, the organic compound layer 35a is in a similar phase to an organic compound layer of a memory element for which writing is not carried out, and data can be erased.

Also, as shown in FIG. 1G, writing can be carried out by utilizing a phase change from the crystal phase (mobility $\mu 3$) to the Iso phase (mobility $\mu 1$). Voltage is applied to the first conductive layer 32 and the second conductive layer 34 of a selected memory element to feed a current, and after heating the organic compound layer 35 that is in the crystal phase to T1 or over, it is rapidly cooled to be fixed in the Iso phase. As a result, a ninth phase change occurs and the organic compound layer 35a is in the Iso phase, and the mobility of the memory element 30 changes to $\mu 1$. In other words, compared to a memory element for which writing has not been carried out, the electrical resistance is increased and the current value is reduced for a memory element for which writing has been carried out. In this manner, data writing is carried out by applying voltage to the pair of conductive layers, and utilizing changes in electrical resistance and current value of the memory element.

A reading operation is described with reference to FIG. 1G. A voltage of under the writing voltage V1 is applied to the first conductive layer 32 and the second conductive layer 34 to feed a current to the memory element. Data reading is carried out by electrically reading disparities in current value and electrical resistance at this time between the memory element and other memory elements.

In an erasing operation in FIG. 1G, after heating the organic compound layer 35a that is in the Iso phase, which is in a memory element for which writing has been carried out, to T1 or over and heightening a fluid property of the organic compound layer 35a, it is slowly cooled to T3 or over and under T2 to be fixed in the crystal phase. Specifically, heating of the memory element is stopped and the organic compound layer 35a is cooled, so that the organic compound layer 35a changes from the Iso phase to the crystal phase. As a result, a tenth phase change occurs and the organic compound layer 35 is in the crystal phase, and the mobility of the memory element 30 is $\mu 3$. In other words, the organic compound layer 35a is in a similar phase to an organic compound layer of a memory element for which writing has not been carried out, and data can be erased.

Also, as shown in FIG. 1H, writing can be carried out by utilizing a phase change from the Sm phase (mobility $\mu 2$) to the Iso phase (mobility $\mu 1$). Voltage is applied to the first conductive layer 32 and the second conductive layer 34 of a selected memory element to feed a current, and after the organic compound layer 35 that is in the Sm phase is heated to T1 or over, it is rapidly cooled to be in fixed in the Iso phase. As a result, an eleventh phase change occurs and the organic compound layer 35a is in the Iso phase, and the mobility of the memory element 30a changes to μ1. In other words, compared to a memory element for which writing has not been carried out, the electrical resistance is increased and the current value is reduced for a memory element for which writing has been carried out. In this manner, data writing is carried out by applying voltage to the pair of conductive layers, and utilizing changes in electrical resistance and current value of the memory element.

A reading operation is described with reference to FIG. 1H. A voltage of under the writing voltage V1 is applied to the first conductive layer 32 and the second conductive layer 34 to feed a current to the memory element. Data reading is carried out by electrically reading disparities in current value and electrical resistance at this time between the memory element and other memory elements.

In an erasing operation in FIG. 1H, after heating the organic compound layer 35a that is in the Iso phase, which is in a memory element for which writing has been carried out, to T1 or over and heightening a fluid property of the organic compound layer, it is slowly cooled to T2 or over and under T1 to be fixed in the Sm phase. Specifically, heating of the memory element is stopped and the organic compound layer 35a is cooled, so that the organic compound layer 35a changes from the Iso phase to the Sm phase. As a result, a twelfth phase change occurs and the organic compound layer 35 is in the Sm phase, and the mobility of the memory element 30 is μ2. In other words, the organic compound layer 35a is in a similar phase to an organic compound layer of a memory element for which writing has not been carried out, and data can be erased.

Further, writing and erasing for a memory element may be carried out by causing a phase change in different smectic phases of SmA to SmH, and utilizing the change in the mobility.

By the above structure, writing and erasing of data can be carried out by applying voltage to a pair of conductive layers of a selected memory element, and causing a phase change of an organic compound layer. Therefore, since a separate device for writing and erasing is not necessary, a memory device can be downsized and simplified.

A structure of a memory element is described with reference to FIGS. 2A to 3C. For the first substrate 31 and the second substrate 33, a quartz substrate, a silicon substrate, a metal substrate, a stainless-steel substrate, or the like can be used other than a glass substrate or a flexible substrate. A flexible substrate is a substrate that can be bent (flexible). For example, a plastic substrate and the like made of polycarbonate, polyarylate, polyethersulfone, and the like are given. Also, a film including a resin layer exhibiting a thermoplastic property (made of polypropylene, polyester, vinyl, polyvinyl fluoride, vinyl chloride or the like) can also be used. In addition to these, the memory element 30 can be provided over an electric filed effect transistor (FET) formed on a semiconductor substrate of Si or the like; or over a thin film transistor (TFT) that is formed over a substrate such as glass. Further, the first substrate 31 and the second substrate 33 may have a light transmitting property or a light shielding property; therefore, range of choice for the substrate is widened.

Also, for the first conductive layer 32 and the second conductive layer 34, a single-layer or a laminated-layer structure of a metal, an alloy, a compound and the like with high conductivity can be used. Typically, light transmitting oxidized conductive films such as indium tin oxide (hereinafter referred to as ITO), indium tin oxide containing silicon, or indium oxide containing 2 to 20% of zinc oxide (ZnO) is given. Also, titanium (Ti), gold (Au), platinum (Pt), nickel (Ni), tungsten (W), chromium (Cr), molybdenum (Mo), iron (Fe), cobalt (Co), copper (Cu), palladium (Pd), or a nitride of these metal materials (for example, titanium nitride (TiN), tungsten nitride (WN), molybdenum nitride (MoN)) and the like are given. Further, alkali metals such as lithium (Li) and cesium (Cs), alkali earth metals such as magnesium (Mg), calcium (Ca) and strontium (Sr), and an alloy containing any of these (MgAg, AlLi); as well as rare-earth metals such as europium (Er) and ytterbium (Yb), an alloy containing these, and the like are given.

For the organic compound layer 35, a compound that is an organic compound (organic semiconductor) which behaves like a semiconductor and exhibits a liquid crystal property is used. Typically, it is a compound represented by the aforementioned general formulas (1) to (13). In any of the cases, m and n are integers of 1 to 5. Further, $R_1$ or $R_2$ represents a straight-chain or branched alkyl group, an alkoxy group, or a group having an unsaturated bond represented by the aforementioned general formula (14). The alkyl group has 1 to 18 carbon atoms. Specifically, a methyl group, an ethyl group, a butyl group, a pentyl group, a hexyl group, an octyl group, a dodecyl group, a pentadecyl group, an octadecyl group or the like is given.

Note that $R_1$ and $R_2$ may be the same group or different groups.

Also, $A_1$ to $A_3$ in the formulas for the compounds represented by the aforementioned general formulas (1) to (13), represent one or a plurality of the aforementioned general formulas (15) to (24). Note that $A_1$ to $A_3$ may be the same group or different groups.

As representative examples of preferable compounds that can be used for the organic compound layer 35, the general formulas (25) to (29) below are given.

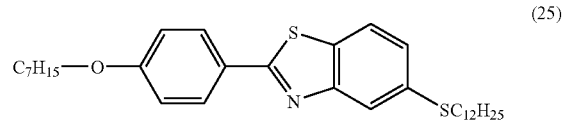

(25)

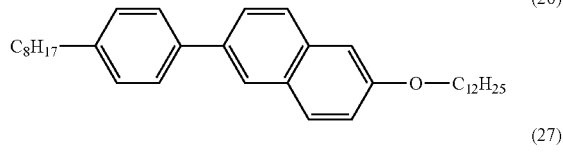

(26)

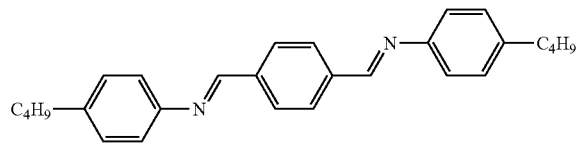

(27)

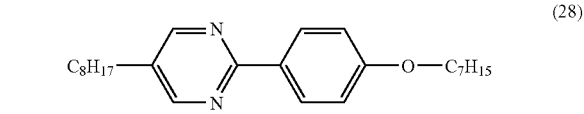

(28)

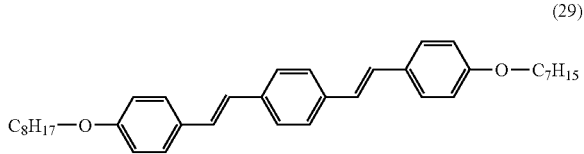

(29)

The organic compound layer 35 can be formed by a known liquid crystal injection method, liquid crystal dropping method, or the like. The thickness of the organic compound layer at this time, in other words the distance between the first conductive layer and the second conductive layer, is 0.5 to 6 µm, preferably 1 to 2 µm.

Figure 4A:
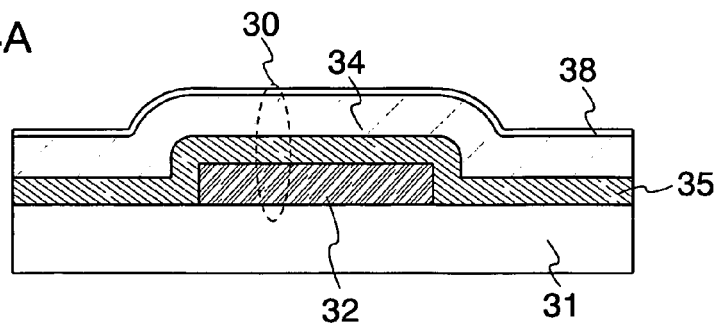
FIGS. 4A to 4D are each cross sectional views describing a memory element of the present invention.

Compared to FIGS. 2A and 2B, a memory element 30 as shown in FIG. 4A does not have a second conductive layer that is formed over the second substrate, and may have a first conductive layer 32, an organic compound layer 35 covering the first conductive layer 32, and a second conductive layer 34 covering the organic compound layer 35. Also, an insulating layer 38 functioning as a protective film is provided herein so as to cover the second conductive layer 34. A memory element with such structure does not require a plurality of substrates; therefore, cost reduction is possible. Further, since the memory element can be formed without attaching the first substrate and the second substrate to each other, a manufacturing process can be simplified.

In a memory element with such structure, the organic compound layer 35 and the second conductive layer 34 can be formed by an evaporation method, an electronic beam evaporation method, or the like. Therefore, the thickness of the organic compound layer is 10 to 300 nm, or desirably 50 to 200 nm. When the thickness of the organic compound layer is thinner than the range mentioned above, the uniformity of the organic compound layer is degraded, and fluctuations in writing and erasing characteristics of the memory element occur easily.

The organic compound layer 35 that is formed by an evaporation method, an electronic beam evaporation method, or the like is the aforementioned organic semiconductor having a liquid crystal property. For the compound exhibiting a liquid crystal property, an organic compound having a molecular weight of 2000 or lower, preferably a molecular weight of 1000 or lower can be used.

The insulating layer 38 functioning as a protective film is preferably formed with silicon nitride, silicon oxide, silicon nitride oxide, silicon oxynitride, DLC (diamond-like carbon), or the like.

Figure 4B:
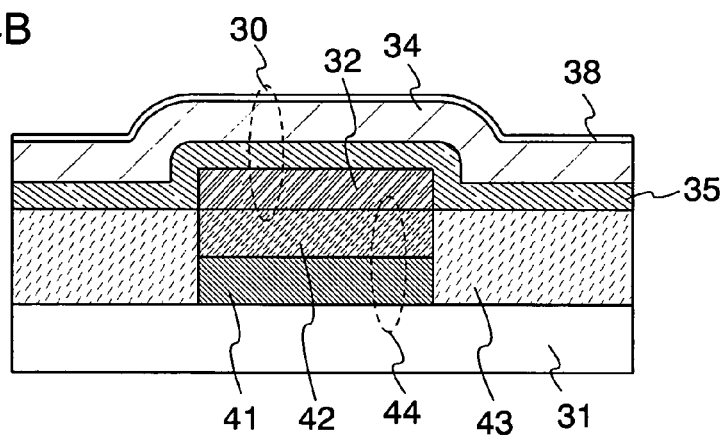

Also, in the memory element 30 shown in FIG. 4A, an element having a rectifying property may be provided on an opposite side of the organic compound layer 35 via the first conductive layer 32 (see FIG. 4B). The element having a rectifying property is a transistor for which a gate electrode and a drain electrode are connected, or a diode. Here, a diode 44 formed of a third conductive layer 41 and a semiconductor layer 42 is provided in contact with the first conductive layer 32. Note that the element having a rectifying property may be provided on the other side of the organic compound layer 35 via a second conductive layer 34. Further, the element having a rectifying property may be provided between the organic compound layer 35 and the first conductive layer 32. Furthermore, the element having a rectifying property may be provided between the organic compound layer 35 and the second conductive layer 34. As representative examples of the diode, a P-N junction diode, a diode including a PIN junction, an avalanche diode, and the like are given. A diode of another structure may also be used. In this manner, by providing the element having a rectifying property, a current only flows in one direction, which reduces reading errors and improves a reading margin.

When there is concern for an effect of an electric field in a lateral direction between memory elements that are adjacent to each other, a partition (insulating layer) may be provided between each of the organic compound layers provided for each memory element, to separate each of the organic compound layer provided for each memory element. In other words, a structure may be that of selectively providing an organic compound layer for each memory element.

Figure 4C:
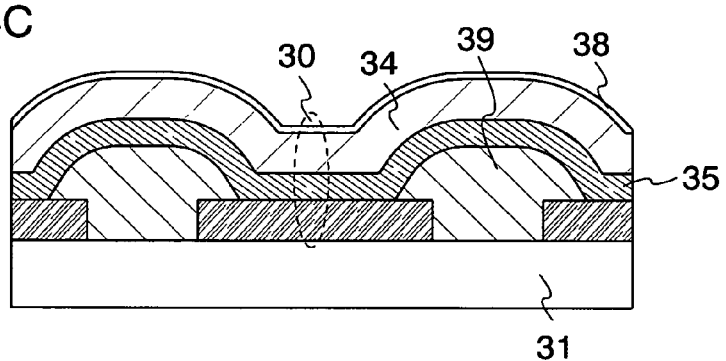

As shown in FIG. 4C, when providing the organic compound layer 35 covering the first conductive layer 32, in order to prevent an effect of an electric field in a lateral direction between each memory cell and a break in the organic compound layer 35 that is caused by steps in the first conductive layer 32, partitions (insulating layers) 39 may be provided between the first conductive layer 32 of each memory element. Note that in a cross-section of the partition (insulating layer) 39, it is preferable that a side surface of the partition (insulating layer) 39 has a gradient angle of 10° or over and under 60° with respect to the surface of the first conductive layer 32, or more preferably 25° to 45°. Furthermore, it is preferable that a surface of the partition (insulating layer) 39 is curved. Subsequently, the organic compound layer 35 and the second conductive layer 34 are formed so as to cover the first conductive layer 32 and the partition (insulating layer) 39.

Figure 4D:
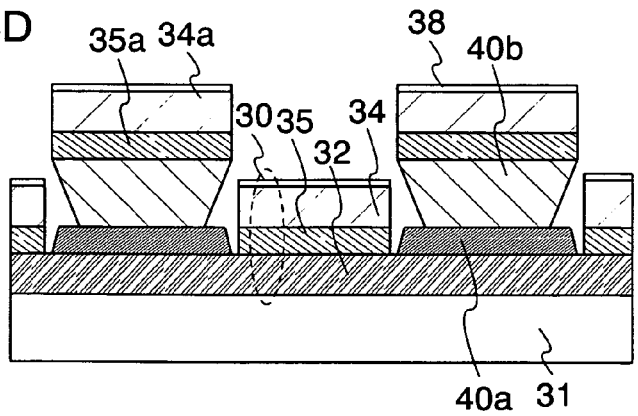

As shown in FIG. 4D, instead of the partition (insulating layer) 39, an interlayer insulating layer 40a covering a portion of the first conductive layer 32, and a partition (insulating layer) 40b formed over the interlayer insulating layer may be provided over the first conductive layer 32 which is over the first substrate 31. A memory element including such interlayer insulating layer 40a and partition (insulating layer) 40b is particularly preferable when a structure is that of the first conductive layer 32 extending in a first direction, and the second conductive layer 34 extending in a second direction that is perpendicular to the first direction.

The interlayer insulating layer 40a covering a portion of the first conductive layer 32 has an opening portion per each memory element 30. Also, the partition (insulating layer) 40b is provided over the interlayer insulating layer in a region where the opening portion is not formed. Further, the partition (insulating layer) 40b extends in the second direction similarly to the second conductive layer 34. Furthermore, in a cross-section of a side wall of the partition (insulating layer) 40b, the partition (insulating layer) 40b has a gradient angle of 95° to 135° with respect to a surface of the interlayer insulating layer.

The partition (insulating layer) 40b is formed according to a photolithography method, by using a positive-type photosensitive resin in which an unexposed portion remains, and adjusting light exposure or developing time so that more of a lower portion of a pattern is etched. Also, the height of the partition (insulating layer) 40b is set to be larger than the thickness of the organic compound layer 35 and the second conductive layer 34. As a result, by a process of evaporating the organic compound layer 35 and the second conductive layer 34 over an entire surface of the first substrate 31 alone, the organic compound layer 35 and the second conductive layer 34 are separated into a plurality of electrically independent regions, and the organic compound layer 35 and the second conductive layer 34 of a stripe form extending in a direction that crosses with the first direction, can be formed. For this reason, the number of steps can be reduced. Note that the organic compound layer 35a and a conductive layer 34a are formed over the partition (insulating layer) 40b; however, they are separated from the organic compound layer 35 and the second conductive layer 34.

The memory device of this embodiment mode is capable of recording and erasing data by applying voltage to a selected pair of conductive layers. Therefore, it is possible to write and erase data at a time other than during manufacturing by selectively heating an arbitrary memory element. Also, since there is no need to provide a separate device for writing and erasing data, the memory device can be downsized and simplified. Furthermore, by forming the memory element using a substrate having a flexible property, a memory device having a flexible property can be manufactured.

Embodiment Mode 2

In this embodiment mode, a structural example of a memory element that is included in a memory device of the present invention is described with reference to drawings. Specifically, a case of a passive matrix type memory device is described.

Figure 5A:
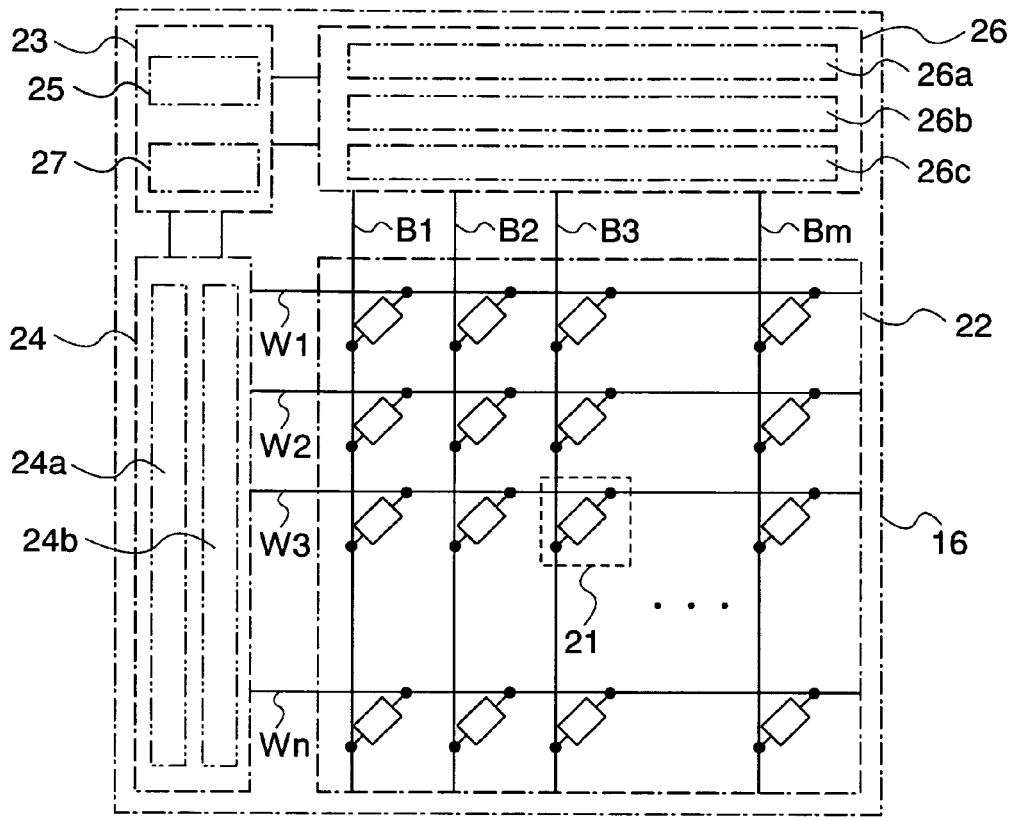
FIGS. 5A and 5B each describe a memory device of the present invention.
Figure 5B:
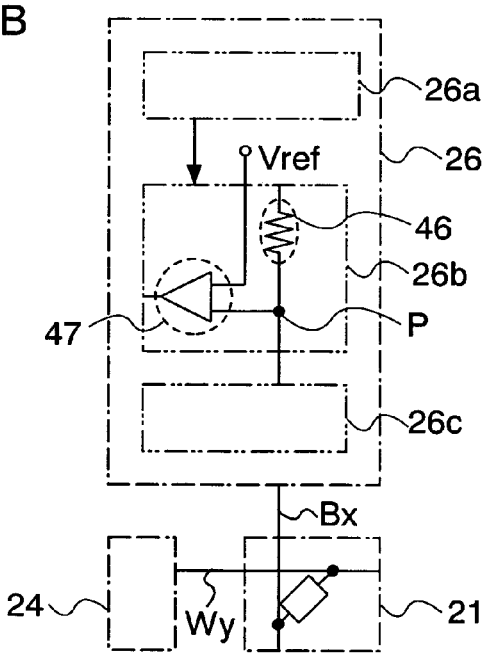

FIG. 5A shows one structural example of a memory device 16 of this embodiment mode, which includes a memory cell array 22 in which memory cells 21 are provided in a matrix form; a bit line driving circuit 26 including a column decoder 26a, a reading circuit 26b, and a selector 26c; a word line driving circuit 24 including a row decoder 24a and a level shifter 24b; an interface 23 including a writing circuit 25, an erasing circuit 27, and the like which interacts with the exterior. The writing circuit 25 and the erasing circuit 27 are each formed by a boosting circuit, a control circuit and the like. Note that, the structure of the memory device 16 shown here is only one example. Other circuits such as a sense amplifier, an output circuit, and a buffer may be provided, and the writing circuit may be provided on the bit line driving circuit.

The memory cell 21 includes a first conductive layer connecting to a bit line Bx ($1 \leq x \leq m$), a second conductive layer connecting to a word line Wy ($1 \leq y \leq n$), and an organic compound layer. The organic compound layer is provided between the first conductive layer and the second conductive layer.

Figure 6A:
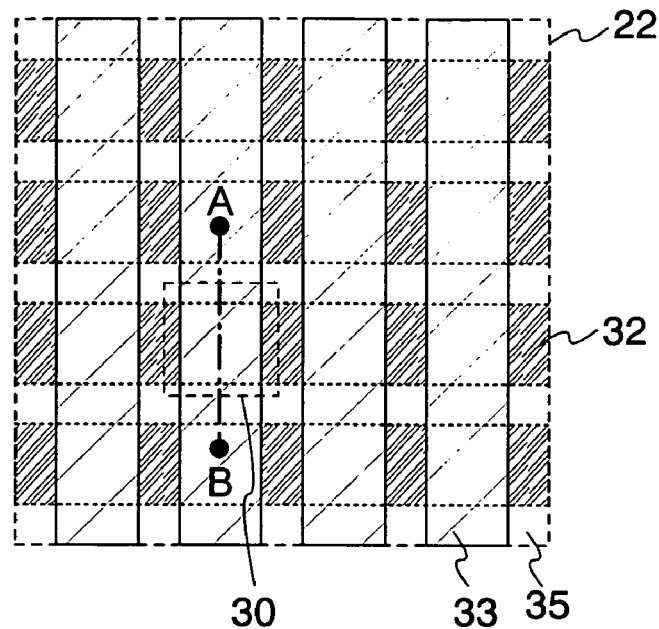
FIGS. 6A and 6B are a top view and a cross sectional view describing a memory device of the present invention.
Figure 6B:
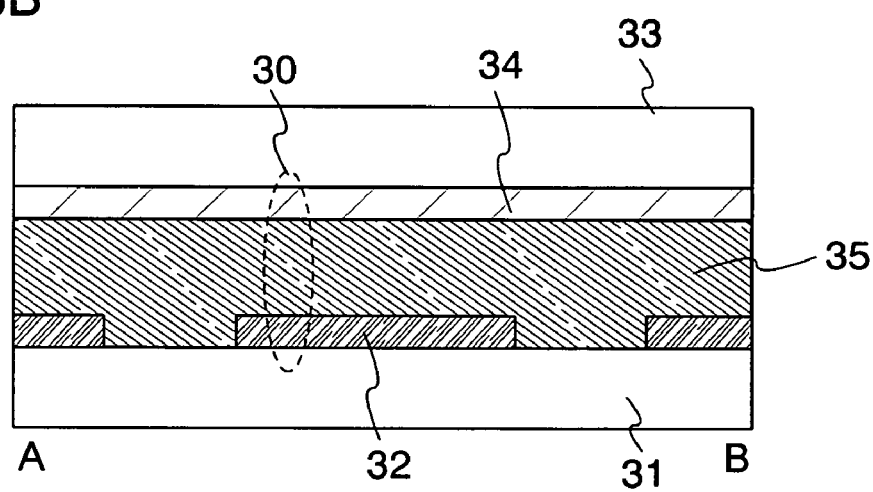

FIGS. 6A and 6B each show an example of an upper surface structure and a cross-sectional structure of the memory cell array 22. Note that FIG. 6A shows an upper surface structure of the memory cell array 22, and FIG. 6B corresponds to a cross-sectional structure of the figure in FIG. 6A taken along a line between A and B. In FIG. 6A, the organic compound layer 35 and the second substrate 33 are omitted.

In the memory cell array 22, the memory cells 21 are provided in a matrix form (see FIG. 6A). The memory cell 21 includes a memory element 30 (see FIG. 6B). The memory element 30 includes a first conductive layer 32 extending in a first direction over a first substrate 31; a second conductive layer 34 extending in a second direction that is perpendicular to the first direction over a second substrate; and the organic compound layer 35 that is interposed between the first conductive layer 32 and the second conductive layer 34.

The memory element 30 described in Embodiment Mode 1 can be appropriately applied to the memory element 30.

Subsequently, an operation for writing data in an organic memory is described (see FIGS. 5A to 6B). Note that writing is carried out by changing an electrical characteristic of a memory cell, and an initial state (a state in which an electrical effect is not applied) of the memory cell has data "0," and a state in which the electrical characteristic is changed is "1."

When data writing is carried out, in a case of writing data "1" in the memory cell 21, the memory cell 21 is selected by the column decoder 26a, selector 26c, row decoder 24a, and level shifter 24b. Specifically, a prescribed voltage V2 is applied to a word line W3 connected to the memory cell 21, by the row decoder 24a and the level shifter 24b. Also, a bit line B3 connected to the memory cell 21 is connected to the writing circuit 25, by the column decoder 26a and selector 26c. Then, a writing voltage V1 is outputted from the writing circuit 25 to the bit line B3. In this manner, a voltage Vw=V1−V2 is applied between the first conductive layer and the second conductive layer which form the memory cell 21. When a first voltage is applied between the first conductive layer 32 and the second conductive layer 34 of the memory cell, the organic compound layer between the first conductive layer 32 and the second conductive layer 34 is heated by Joule heat. As a result, the organic compound layer changes from a first phase to a second phase, and the mobility of the organic compound layer changes. Consequently, data "1" is written by electrically changing the memory element (see FIG. 5A).

In a case of using the first writing operation of Embodiment Mode 1, compared to other memory elements, the memory element for which the phase of the organic compound layer has been changed from the first phase with a low mobility to the second phase with a high mobility has a significantly smaller electrical resistance and a larger current value. In this manner, data writing is carried out by utilizing a change in the electrical resistance of the memory element, by applying voltage. For example, in a case that an organic compound layer to which the first voltage is not applied has data "0," and when data "1" is to be written, voltage is applied to a pair of conductive layers of a desired memory element to cause a phase change of the organic compound layer, so that the electrical resistance of the memory element is made small and the current value is made large.

In a case of using the second writing operation of Embodiment Mode 1, compared to other memory elements, the memory element for which the phase of the organic compound layer has been changed from the first phase with a high mobility to the second phase with a low mobility has a larger electrical resistance and a smaller current value. Data writing may also be carried out by applying the aforementioned.

Note that an unselected word line and an unselected bit line are controlled so that data "1" is not written in a memory cell that is connected thereto. For example, the unselected word line and the unselected bit line may be in floating state. A characteristic that can secure selectivity, such as a diode characteristic, is necessary between the first conductive layer and the second conductive layer that form a memory cell.

On the other hand, data "0" is written in the memory cell 21 by not applying an electrical effect on the memory cell 21. In terms of circuit operation, for example, the memory cell 21 is selected by the column decoder 26a, the selector 26c, the row decoder 24a, and the level shifter 24b, in a similar manner to when "1" is written; however, an output potential from the writing circuit 26b to the bit line B3 is to be comparable to a potential of a selected word line W3 or a potential of an unselected word line, and between the first conductive layer and the second conductive layer that form the memory cell 21, a voltage of a degree that does not change the electrical characteristic of the memory cell 21 may be applied.

Subsequently, an operation of erasing data from an organic memory is described. In a case of erasing data using the first erasing operation in Embodiment Mode 1, the single memory element 30 is selected by the row decoder 24a, the column decoder 26a, and the selector 26c; then, data in the memory cell 21 is erased using the erasing circuit 27. When voltage is applied between the first conductive layer 32 and the second conductive layer 34 of a memory cell, the organic compound layer between the first conductive layer 32 and the second conductive layer 34 is heated by Joule heat. As a result, a phase change of the organic compound layer occurs from a second phase with a high mobility to a first phase with a low mobility, and the mobility of the organic compound layer changes. Consequently, the electrical resistance of the memory element is changed.

Note that in a case of erasing data using the first erasing operation in Embodiment Mode 1, for a memory element in which the phase of the organic compound layer has been changed from a first phase with a low mobility to a second phase with a high mobility by writing, a phase change of the organic compound layer from a second phase with a low mobility to a first phase with a high mobility occurs by slowly cooling after it is heated once, and the mobility of the organic compound layer is changed. Data erasing may be carried out by applying the aforementioned.

The memory element in which the phase of the organic compound layer is changed from the second phase to the first phase has a similar electrical resistance to that of the memory element prior to writing. In this manner, by applying voltage, data erasing is carried out by utilizing a change in the electrical resistance of the memory element.

Subsequently, an operation for reading data from an organic memory is described. Here, a structure of the reading circuit 26b is that of including a resistance element 46 and a sense amplifier 47. However, a structure of the reading circuit 26b is not restricted to the above structure, and the reading circuit 26b may have any kind of structure.

Data reading is carried out by applying voltage between the first conductive layer 32 and the second conductive layer 34 and reading the electrical resistance of an organic compound layer 35. For example, as mentioned above, in a case of writing data by applying voltage, a resistance value Ra1 when voltage is not applied and a resistance value Rb1 when voltage is applied and the phase of the organic compound is changed, satisfies Ra1>Rb1. Data is read by electrically reading such difference between resistance values.

For example, in a case of reading data from a memory cell 21 located in column x, row y, among a plurality of memory cells 21 that are included in the memory cell array 22, first, a bit line Bx in column x and a word line Wy in row y are selected by the row decoder 24a, the column decoder 26a, and the selector 26c. Consequently, an organic compound layer that is included in the memory cell 21 and the resistance element 46 become serially connected. In this manner, when voltage is applied to both ends of two resistance elements connected serially, the potential of a node P becomes a resistance-divided potential in accordance with a resistance value Ra or Rb of the organic compound layer 35. Then, the potential of the node P is supplied to the sense amplifier 47, and in the sense amplifier 47, which of the data "0" or "1" is contained is judged. Subsequently, a signal containing data "0" or "1" that is judged in the sense amplifier 47 is supplied to the exterior, and data can be read.

According to the above method, a condition of the electrical resistance of the organic compound layer 35 is read with a voltage value utilizing a disparity between resistance values, and resistance division. However, a method of comparing current values is also acceptable. This, for example, utilizes the satisfaction of Ia1<Ib1, wherein Ia1 is a current value of when voltage is not applied to the organic compound layer, and Ib1 is a current value of when voltage is applied to the organic compound layer to cause a phase change.

The memory device of this embodiment mode is capable of recording and erasing data by applying voltage to a pair of conductive layers. Therefore, it is possible to write and erase data at a time other than during manufacturing by selectively heating an arbitrary memory element. Also, since there is no need to provide a separate device for writing and erasing data, the memory device can be downsized and simplified. Further, by forming a memory element using a substrate having a flexible property, a memory device having a flexible property can be manufactured.

Embodiment Mode 3

In this embodiment mode, a memory device having a different structure from that of the above Embodiment Mode 2 is described. Specifically, a case of an active matrix type memory device is described.

Figure 7A:
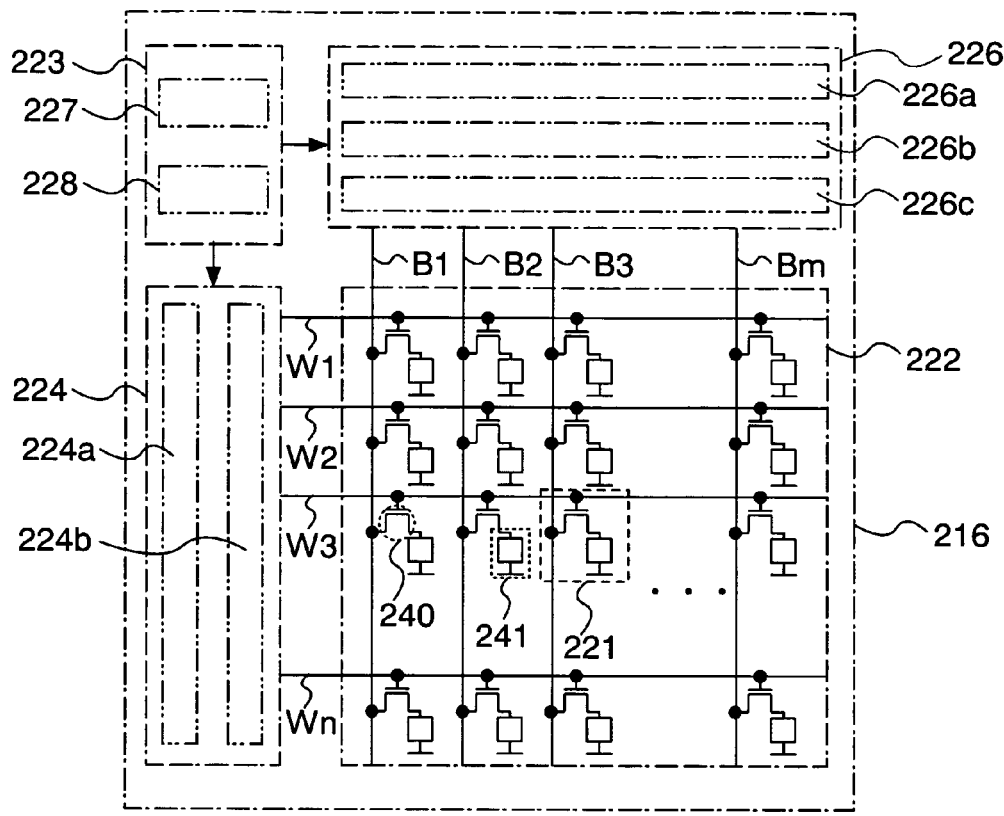
FIGS. 7A and 7B each describe a semiconductor device of the present invention.
Figure 7B:
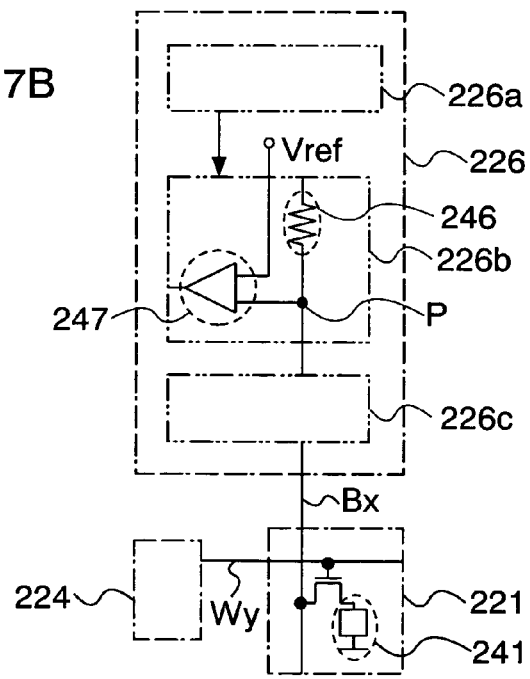

A structural example of the memory device that is described in this embodiment mode is shown in FIG. 7A, which includes a memory cell array 222 in which memory cells 221 are provided in a matrix form; a bit line driving circuit 226 including a column decoder 226a, a reading circuit 226b, and a selector 226c; a word line driving circuit 224 including a row decoder 224a and a level shifter 224b; and an interface 223 including a writing circuit 227, an erasing circuit 228, and the like which interacts with the exterior. The writing circuit 227 and the erasing circuit 228 are each formed by a boosting circuit, a control circuit and the like. Note that, the structure of a memory device 216 shown here is only one example. Other circuits such as a sense amplifier, an output circuit, and a buffer may be provided, and the writing circuit may be provided on the bit line driving circuit.

The memory cell 221 includes a first wire that is connected to a bit line Bx ($1 \leq x \leq m$), a second wire that is connected to a word line Wy ($1 \leq y \leq n$), a transistor 240, and a memory element 241. The memory element 241 has a structure of interposing an organic compound layer between a pair of conductive layers.

Figure 8A:
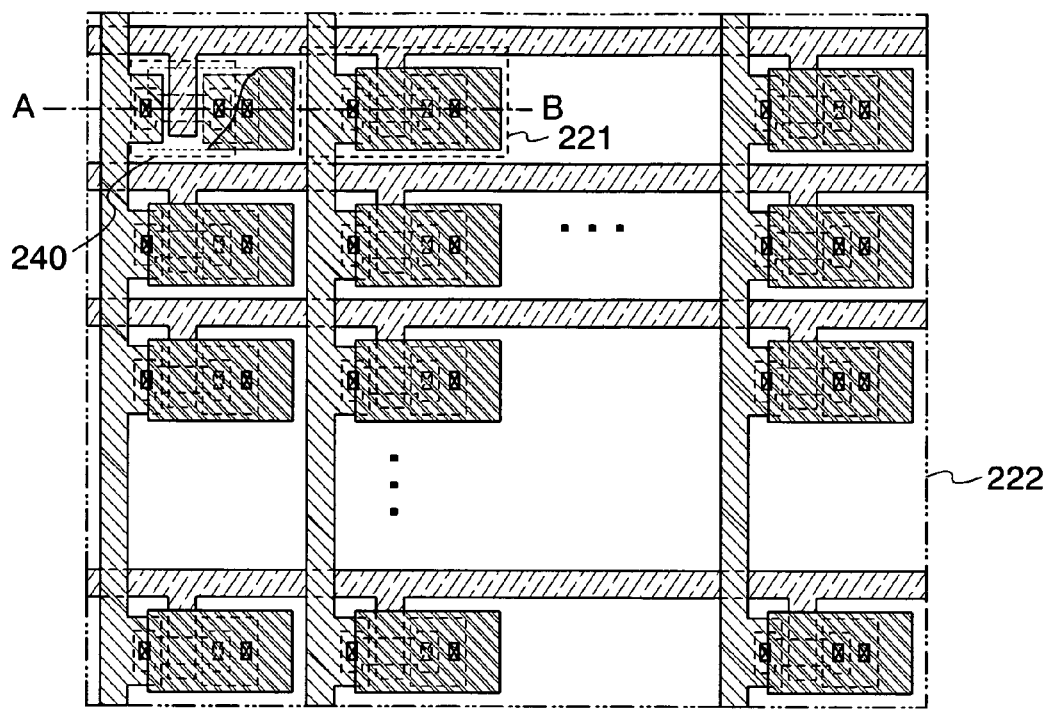
FIGS. 8A and 8B are a top view and a cross sectional view describing a memory device of the present invention.
Figure 8B:
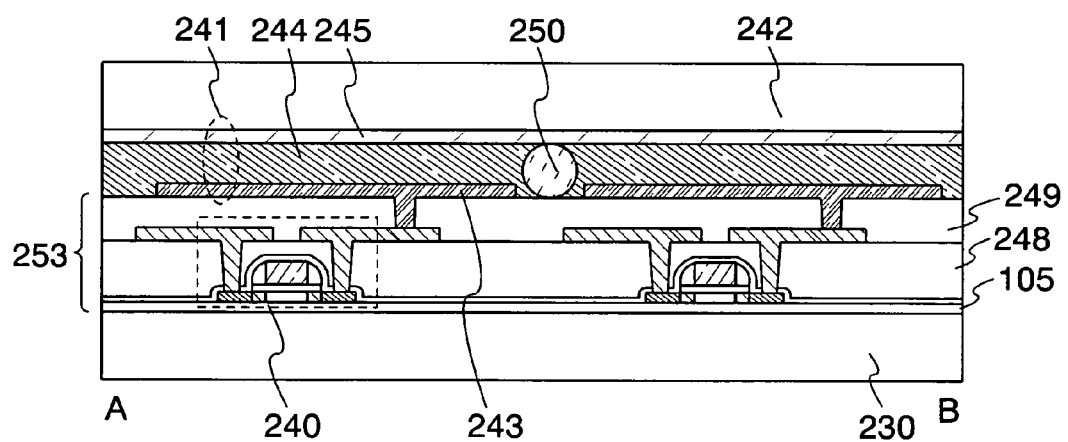

Subsequently, an example of a top view and a cross-sectional view of the memory cell array 222 having the above structure is described with reference to FIGS. 8A and 8B. Note that FIG. 8A shows an example of a top view of the memory cell array 222 and FIG. 8B shows a cross-sectional view of the figure in FIG. 8A taken along a line between A and B. Also note that in FIG. 8A, a second substrate and a second conductive layer that is formed thereover are omitted. Further, a portion of a first conductive layer that is connected to a source wire or a drain wire of the transistor 240 is omitted.

In the memory cell array 222, a plurality of the memory cells 221 are provided in a matrix form. The memory cell 221 includes a transistor 240 functioning as a switching element over a first substrate 230, and the memory element 241 that is connected to the transistor 240. The memory element 241 is formed over an insulating layer 249 covering the transistor 240, and is formed by a first conductive layer 243 that is connected to a source wire or a drain wire of the transistor 240; a second conductive layer 245 that is formed over a second substrate 242; and an organic compound layer 244 that is interposed between the first conductive layer 243 and the second conductive layer 245. Also, in order for a distance (cell gap) between the first substrate 230 over which the transistor and the first conductive layer are formed, and the second substrate 242 to be constant, a spacer 250 may be provided between the insulating layer 249 and the second conductive layer 245. Note that here, an insulating layer 105, the transistor 240, the insulating layer 249 covering the transistor 240, and the first conductive layer 243 are an element forming layer 253 (see FIGS. 8A and 8B).

For the first conductive layer 243 and the second conductive layer 245, the material and formation method for the first conductive layer 32 and the second conductive layer 34 described in Embodiment Mode 1 can be appropriately used. Also, a thin film transistor is used as the transistor 240.

Figure 15A:
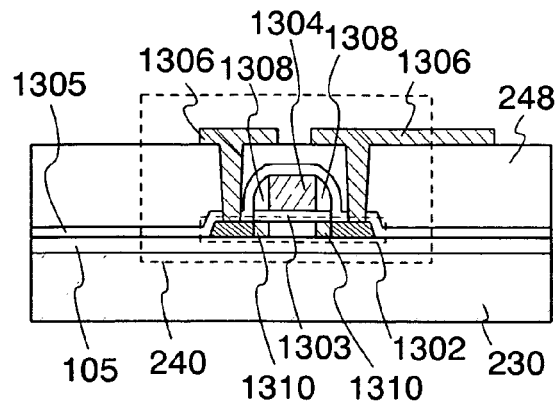
FIGS. 15A to 15D are each cross sectional views of a transistor that can be applied to the present invention.

An aspect of the thin film transistor that can be used for the transistor 240 is described with reference to FIGS. 15A to 15D. FIG. 15A shows an example where a top gate type thin film transistor is applied. The thin film transistor is provided over the insulating layer 105 which is provided over the first substrate 230. For the thin film transistor, a semiconductor layer 1302 that is formed over the insulating layer 105, and an insulating layer 1303 that can function as a gate insulating layer are provided. A gate electrode 1304 is formed over the insulating layer 1303 in response to the semiconductor layer 1302, and an insulating layer 1305 functioning as a protective layer, and an insulating layer 248 functioning as an interlayer insulating layer are provided thereover. Also, a source or drain wire 1306 that is connected to each of a source region and a drain region of the semiconductor layer is formed. Further, an insulating layer functioning as a protective layer may be formed thereover.

The semiconductor layer 1302 is a layer formed of a semiconductor having a crystal structure, and a non-single crystal semiconductor or a single crystal semiconductor can be used. In particular, a crystalline semiconductor in which an amorphous or a microcrystalline semiconductor is crystallized by laser light irradiation, a heating process, or a combination of laser light irradiation and a heating process, is preferably applied. For a heating process, a crystallization method using a metal element such as nickel which has an effect of promoting a crystallization of a silicon semiconductor can be applied.

In a case where crystallization is done by laser light irradiation, crystallization can be carried out by continuous wave laser light irradiation, or by irradiation with an ultrashort pulsed laser light having a high repetition rate of 10 MHz or more, and a pulse width of 1 nanosecond or less, preferably 1 to 100 picoseconds; wherein a melt zone of a melted crystalline semiconductor is continuously moved in an irradiation direction of the laser light. By such a crystallization method, a crystalline semiconductor having a larger grain diameter with a crystal grain boundary extending in one direction can be obtained. By making a drift direction of carriers consistent with the direction in which the crystal grain boundary extends, an electron filed-effect mobility of a transistor can be heightened. For example, a mobility of 400 $cm^2/V\cdot sec$ or more can be realized.

In a case of using the aforementioned crystallization step for a crystallization process at or under an allowable upper temperature limit (about 600° C.) of a glass substrate, a large area glass substrate can be used. Consequently, a large amount of semiconductor devices can be manufactured per substrate, and cost reduction is possible.

Also, the semiconductor layer 1302 may be formed by carrying out a crystallization step by heating at or over the allowable upper temperature limit of the glass substrate. Typically, the semiconductor layer 1302 is formed by using a quartz substrate as an insulating substrate, and heating an amorphous or a microcrystalline semiconductor at or over 700° C. As a result, a highly crystalline semiconductor can be formed. Consequently, a thin film transistor with characteristics that are excellent such as response speed and mobility, which is capable of high speed operation, can be provided.

The gate electrode 1304 can be formed with a metal or a polycrystalline semiconductor doped with an impurity imparting one conductivity type. When a metal is used, tungsten (W), molybdenum (Mo), titanium (Ti), tantalum (Ta), aluminum (Al), or the like can be used. Also, a metal nitride for which the aforementioned metal is nitrided can be used. Alternatively, a structure may be that of laminating a first layer made of the metal nitride and a second layer made of the metal. In a case of a laminated structure, a form may be that of an end portion of the first layer sticking out further to the outside than an end portion of the second layer. By making the first layer here a metal nitride, it can be a barrier metal. In other words, the metal of the second layer can be prevented from diffusing to the insulating layer 1303 or the semiconductor layer 1302 that is a layer thereunder.

For side surfaces of the gate electrode 1304, sidewalls (sidewall spacer) 1308 are formed. Each sidewall can be formed by forming an insulating layer that is formed by silicon oxide by a CVD method over a substrate, and then carrying out anisotropic etching by an RIE (reactive ion etching) method.

For the transistor which is formed by combining the semiconductor layer 1302, the insulating layer 1303, the gate electrode 1304, and the like, various structures such as a single drain structure, an LDD (Lightly-Doped Drain) structure, or a gate-overlapped drain structure can be applied. Here, a thin film transistor having an LDD structure in which a low concentration impurity region 1310 is formed in a part of the semiconductor layer that overlaps the sidewall is shown. Moreover, a single gate structure, a multi-gate structure in which transistors to which gate voltage having the same potential equally is applied are serially connected, or a dual gate structure in which gate electrodes sandwich a semiconductor layer on its upper and lower sides, can be applied.

The insulating layer 248 is formed with an inorganic insulating material such as silicon oxide or silicon oxynitride, or an organic insulating material such as an acrylic resin or a polyimide resin. In the case of forming the insulating layer by a coating method such as spin coating or a roll coater, after applying an insulating film material dissolved in an organic solvent, a heat treatment is performed thereto, thereby forming the insulating layer with silicon oxide. For example, after forming a film including a siloxane bond by a coating method, a heat treatment is conducted at 200 to 400° C., thereby forming the insulating layer with silicon oxide. By using an insulating layer formed by a coating method or an insulating layer which has been flattened by reflow as the insulating layer 248, it is possible to prevent a wiring to be formed over the layer from breaking. Moreover, the insulating layer can also be used effectively when forming a multilayer wiring.

The source or drain wire 1306 formed over the insulating layer 248 can be provided so as to intersect with a wiring to be formed with the same layer as the gate electrode 1304 and has a multilayer wiring structure. The multilayer wiring structure can be obtained by forming wires over a plurality of stacked insulating layers which have a similar function to the insulating layer 248. The source or drain wire 1306 is preferably formed with a combination of a low resistant material like aluminum (Al) and a metal barrier using a metal material having a high melting point such as titanium (Ti) or molybdenum (Mo), for example a lamination structure of titanium (Ti) and aluminum (Al), molybdenum (Mo) and Aluminum (Al), or the like.

Figure 15B:
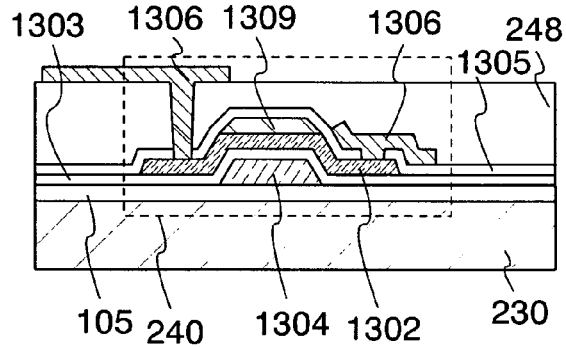

FIG. 15B shows an example of applying a bottom gate type thin film transistor. The insulating layer 105 is formed over the first substrate 230, and the thin film transistor is provided thereover. In the thin film transistor, the gate electrode 1304, the insulating layer 1303 functioning as a gate insulating layer, the semiconductor layer 1302, a channel protection layer 1309, the insulating layer 1305 functioning as a protective layer, and the insulating layer 248 functioning as an interlayer insulating layer are provided. Moreover, an insulating layer functioning as a protective layer may be formed thereover. The source or drain wire 1306 can be formed over the insulating layer 1305 or the insulating layer 248. In the case of the bottom gate thin film transistor, the insulating layer 105 is not necessarily formed.

Also, when the first substrate 230 is a substrate having a flexible property, an allowable upper temperature limit of the substrate is lower than that of an inflexible substrate such as a glass substrate. Consequently, the thin film transistor is preferably formed using an organic semiconductor.

Figure 15C:
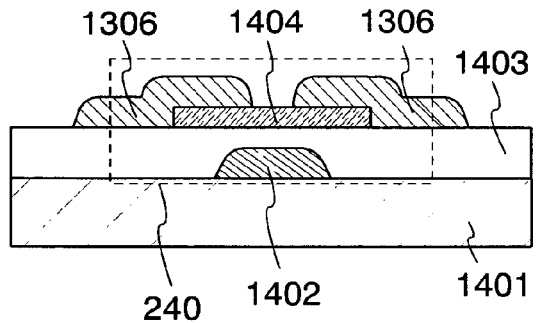

Here, a structure of the thin film transistor using an organic semiconductor is described with reference to FIGS. 15C and 15D. FIG. 15C shows an example of applying a staggered organic semiconductor transistor. An organic semiconductor transistor is provided over a substrate 1401 having a flexible property. In the organic semiconductor transistor, a gate electrode 1402, an insulating layer 1403 functioning as a gate insulating film, a semiconductor layer 1404 which overlaps with a gate electrode and an insulating layer functioning as a gate insulating film, and the source or drain wire 1306 connecting to the semiconductor layer 1404. Note that the semiconductor layer is partly sandwiched by the insulating layer 1403 functioning as a gate insulating film, and the source and drain wires 1306.

The gate electrode 1402 can be formed by a similar material and method to the gate electrode 1304. Also, the gate electrode 1402 can be formed by drying and baking using a droplet discharging method. Further, the gate electrode 1402 may be formed by printing a paste including fine particles by a printing method over the substrate having a flexible property, and then drying and baking the paste. As a representative example of the fine particles, fine particles mainly including any of gold; copper; an alloy of gold and silver; an alloy of gold and copper; an alloy of silver and copper; or an alloy of gold, silver and copper may be given. Furthermore, the fine particles may mainly include a conductive oxide such as indium tin oxide (ITO).

The insulating layer 1403 functioning as a gate insulating film can be formed by a similar material and method to the insulating layer 1303. However, in a case of forming the insulating layer by a heat process after coating with an insulating film material dissolved in an organic solvent, the heat process temperature is to be lower than the allowable upper temperature limit of the substrate having a flexible property.

As a material for the semiconductor layer 1404 of the organic semiconductor transistor, a polycyclic aromatic compound, a conjugated double bond compound, phthalocyanine, a charge transfer complex, and the like can be given. For example, anthracene, tetracene, pentacene, 6T (hexathiophene), TCNQ (tetra-cyanoquinodimethane), PTCDA (perylene carboxylic acid anhydrous compound), NTCDA (naphthalene carboxylic acid anhydrous compound), and the like can be given. Further, as a material for the semiconductor layer 1404 of the organic semiconductor transistor, a π-conjugated system high molecular compound such as an organic high molecular compound; carbon nanotube; polyvinyl pyridine; a phthalocyanine metal complex; and the like can be given. In particular, a π-conjugated system high molecular compound whose skeleton is composed of a conjugated double bond such as polyacetylene, polyaniline, polypyrrole, polythienylene, a polythiophene derivative, poly (3-alkylthiophene), a polyparaphenylene derivative, or a polyparaphenylenevinylene derivative, is preferably used.

As a method for forming the semiconductor layer of the organic semiconductor transistor, a method for forming a film having a uniform thickness over a substrate may be used. The thickness is preferably set to be 1 nm to 1,000 nm, and more preferably, 10 nm to 100 nm. As a specific method, an evaporation method, a coating method, a spin coating method, a bar coat method, a solution cast method, a dipping method, a screen printing method, a roll coater method, or a droplet discharging method can be used.

Figure 15D:
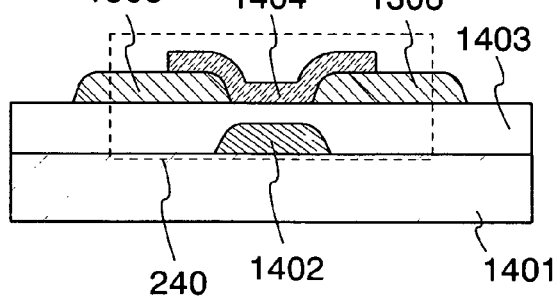

FIG. 15D shows an example of applying a coplanar type organic semiconductor transistor. An organic semiconductor transistor is provided over the substrate 1401 having a flexible property. In the organic semiconductor transistor, the gate electrode 1402, the insulating layer 1403 functioning as a gate insulating film, the source or drain wire 1306, and the semiconductor layer 1404 which overlaps with a gate electrode and an insulating layer functioning as a gate insulating layer. Also, the source or drain wire 1306 is partly sandwiched by the insulating layer functioning as a gate insulating layer and the semiconductor layer.

Furthermore, the thin film transistor and the organic semiconductor transistor may have any kind of structure as long as they can function as a switching element.

Also, the transistor 240 may be formed using a single crystal substrate or an SOI substrate, and a memory element may be provided thereover. The SOI substrate may be formed using a method of attaching wafers or a method called SIMOX, by which an insulating layer is formed internally by implanting oxygen ions into a Si substrate. Since such transistor formed with a single crystal semiconductor has characteristics that are excellent such as response speed and mobility, a transistor that is capable of high speed operation can be provided. Also, the transistor has little fluctuation in its characteristics; therefore, a semiconductor device for which high reliability is realized can be provided.

The insulating layer 249 is preferably formed by a heat process after coating with an insulating film material dissolved in an organic solvent by a coating method such as spin coating or roll coater. Consequently, the flatness of a surface of the insulating layer 249 can be improved. Also, regardless of a location of the source or drain wire 1306 of the transistor, the first conductive layer 243 can be freely positioned. As a result, further integration of the memory element and the transistor is possible.

Materials and formation methods of the first conductive layer 243 and the second conductive layer 245 may be similar to any of the materials and formation methods described in the aforementioned Embodiment Mode 1.

Also, the organic compound layer 244 can be provided using a similar material and formation method to those of the organic compound layer 35 shown in the aforementioned Embodiment Mode 1.

An element having a rectifying property may be provided between the first conductive layer 243 and the organic compound layer 244. The element having a rectifying property is a transistor for which a gate electrode and a drain electrode are connected to each other, or a diode. Note that the element having a rectifying property may be provided between the organic compound layer 244 and the second conductive layer 245.

For the spacer 250, a spacer that is spherical, columnar or the like can be appropriately used. Although a spherical spacer is dispersed here, a columnar spacer may be formed using an organic resin or the like, over the insulating layer 249 or the second conductive layer 245.

Furthermore, instead of the memory element 241, a memory element such as the one shown in FIGS. 4A to 4D in Embodiment Mode 1 can be appropriately used, for which the second conductive layer of the memory element is not formed over the second substrate, and the organic compound layer and the second conductive layer are laminated over the first conductive layer.

Figure 10:
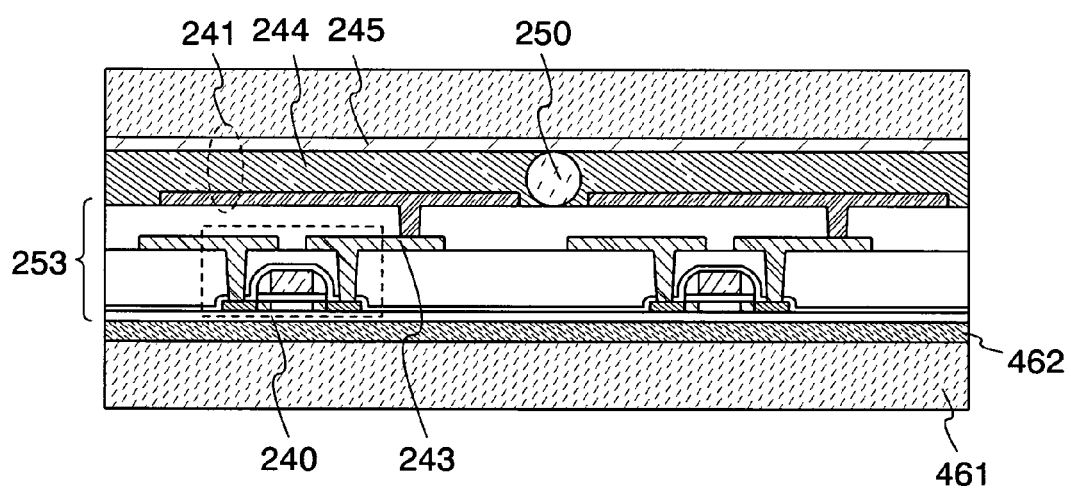
FIG. 10 is a cross sectional view describing a semiconductor device of the present invention.

Also, after providing a separation layer over the first substrate 230 and providing the element forming layer 253 over the separation layer, the element forming layer 253 may be separated from the separation layer, and the element forming layer 253 may be attached to a third substrate 461 with an adhesion layer 462 (see FIG. 10). As a separation method, the following methods or the like may be used: (1) a method of separation by providing a metal oxide layer as the separation layer between a first substrate having a high heat resistance property and the element forming layer 253, and then weakening the metal oxide layer by crystallization, and separating the element forming layer 253; (2) a method of providing an amorphous silicon film including hydrogen as the separation layer between the first substrate having a high heat resistance property and the element forming layer 253, and then separating the substrate having a high heat resistance property by releasing hydrogen gas from the amorphous silicon film through laser light irradiation, or separating the element forming layer 253 by providing an amorphous silicon film as the separation layer and removing the amorphous silicon film by etching; (3) a method of mechanically removing a first substrate having a high heat resistance property where the element forming layer 253 is formed, or etching the first substrate away with the use of a solution or a halogen fluoride gas such as $NF_3$, $BrF_3$, or $ClF_3$; or (4) a method of providing a metal layer and a metal oxide layer as separation layers between the first substrate having a high heat resistance property and the element forming layer 253, and then weakening the metal oxide layer by crystallization as well as etching away a portion of the metal layer with the use of a solution or a halogen fluoride gas such as $NF_3$, $BrF_3$, or $ClF_3$, to physically separate the weakened metal oxide layer.

For the third substrate 461, by using a flexible substrate, a film including a resin layer showing thermoplasticity, or the like as shown by the first substrate 31 in Embodiment Mode 1, reduction in size, thickness, and weight of a memory device is possible.

Subsequently, an operation for writing data in the memory device 216 is described (see FIGS. 7A to 8B).

First, an operation for writing data by applying voltage is described. Here, a case of writing data in the memory cell 221 located in column x, row y is described. In this case, a bit line Bx in column x and a word line Wy in row y are selected by the row decoder 224a, the column decoder 226a, and the selector 226c, so that the transistor 240 included in the memory cell 221 in column x, row y is turned on. Subsequently, by a writing circuit, a prescribed voltage is applied to the bit line Bx in column x. The voltage applied to the bit line Bx in column x is connected to the first conductive layer 243 of a selected memory element, and a difference in potential occurs between the first conductive layer 243 and the second conductive layer 245. Consequently, the organic compound layer 244 is heated by Joule heat. As a result, a phase change of the organic compound layer occurs, and the mobility of the organic compound layer is changed. Consequently, the electrical resistance of the memory element is changed.

In a case of using the first writing operation of Embodiment Mode 1, compared to other memory elements, a memory element for which the phase of the organic compound layer is changed from the first phase with a low mobility to the second phase with a high mobility has a significantly smaller electrical resistance and a larger current value. In this manner, data writing is carried out by utilizing a change in the electrical resistance of the memory element, by applying voltage. For example, in a case where an organic compound layer to which the first voltage is not applied has data "0," and when data "1" is to be written, voltage is applied to a pair of conductive layers of a desired memory element to cause a phase change of the organic compound layer, so that the electrical resistance of the memory element is made small and the current value is made large.

In a case of using the second writing operation of Embodiment Mode 1, compared to other memory elements, the memory element for which the phase of the organic compound layer is changed from the first phase with a high mobility to the second phase with a low mobility has a larger electrical resistance and a smaller current value. Data writing may be carried out by applying the aforementioned.

Subsequently, an operation for erasing data by applying voltage is described. In a case of erasing data using the first erasing operation of Embodiment Mode 1, a bit line Bx in column x and a word line Wy in row y are selected by the row decoder 224a, the column decoder 226a, and the selector 226c, so that the transistor 240 included in the memory cell 221 in column x, row y is turned on. Subsequently, by an erasing circuit, a prescribed voltage is applied to the bit line Bx in column x. The voltage applied to the bit line Bx in column x is connected to the first conductive layer 243 of a selected memory element, and a difference in potential occurs between the first conductive layer 243 and the second conductive layer 245. Consequently, the organic compound layer 244 is heated by Joule heat. As a result, a phase change of the organic compound layer from the second phase with a high mobility to the first phase with a low mobility occurs, and the mobility of the organic compound layer is changed. Consequently, the electrical resistance of the memory element is changed.

Note that in a case of erasing data using the second erasing operation of Embodiment Mode 1, by heating and then slowly cooling a memory element for which the phase of an organic compound layer has been changed from the first phase with a high mobility to the second phase with a low mobility by writing, a phase change occurs for the organic compound layer from the second phase with a low mobility to the first phase with a high mobility, and the mobility of the organic compound layer is changed. Data erasing may be carried out by applying the aforementioned.

The memory element in which the phase of the organic compound layer has been changed from the second phase to the first phase has a similar electrical resistance to that of the memory element prior to writing. In this manner, by applying voltage, data erasing is carried out by utilizing a change in the electrical resistance of the memory element.

Subsequently, an operation for reading data by applying voltage is described. Here, a structure of the reading circuit 226b is to include a resistance element 246 and a sense amplifier 247. However, the structure of the reading circuit 226b is not restricted to the aforementioned structure, and the reading circuit 226b may have any kind of structure.

Data reading is carried out by applying voltage between the first conductive layer 243 and the second conductive layer 245, and reading a condition of a phase of the organic compound layer 244. Specifically, data reading is carried out by electrically reading the resistance value of the organic compound layer 244. For example, in a case of reading data of a memory cell 221 in column x, row y, among a plurality of memory cells 221 included in the memory cell array 222, first, the bit line Bx in column x and the word line Wy in row y are selected by the row decoder 224a, the column decoder 226a, and the selector 226c. Consequently, the transistor 240 included in the memory cell 221 located in column x, row y is turned on.

Subsequently, the memory element 241 included in the memory cell 221 and the resistance element 246 are in a serially connected state. At this time, the memory element 241 can be considered as a single resistance element, and when voltage is applied to both ends of two resistance elements connected serially in this manner, the potential of a node P becomes a resistance-divided potential in accordance with a resistance value Ra or Rb of the memory element 241. Then, the potential of the node P is supplied to the sense amplifier 247, and in the sense amplifier 247, which of the data "0" or "1" is contained is judged. Subsequently, a signal containing data "0" or "1" that is judged in the sense amplifier 247 is supplied to the exterior.

Figure 11:
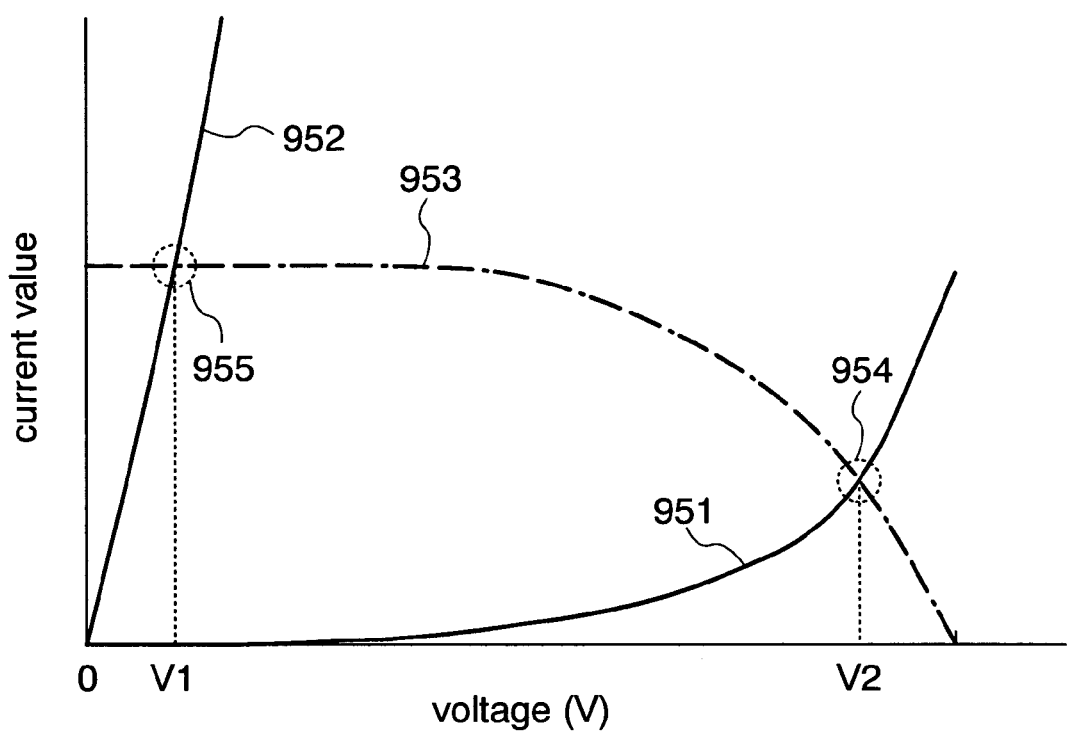
FIG. 11 describes a current-voltage characteristic of a memory element and a resistance element that can be applied to the present invention.

An operation for reading data from a memory element by applying voltage in a case of using a transistor as a resistance element is described by giving a specific example in FIG. 11.

FIG. 11 shows a current-voltage characteristic 951 of a memory element for which writing is not carried out, in other words a memory element with data "0," a current-voltage characteristic 952 of the memory element for which writing of data "1" has been carried out, and a current-voltage characteristic 953 of the resistance element 246, and a case of using a transistor as the resistance element 246 is described herein.

In FIG. 11, in a memory cell including the memory element with data "0," an intersection point 954 of the current-voltage characteristic 951 of the memory element and the current-voltage characteristic 953 of the transistor becomes an operation point, and the potential of the node P at this time is V2 (V). The potential of the node P is supplied to the sense amplifier 247 and in the sense amplifier 247, data that is stored in the aforementioned memory cell is judged as "0."

On the other hand, in a memory cell including a memory element for which wiring of data "1" has been carried out, an intersection point 955 of the current-voltage characteristic 952 of the memory element and the current-voltage characteristic 953 of the transistor becomes an operation point, and the potential of the node P at this time is V1 (V) (V1<V2). The potential of the node P is supplied to the sense amplifier 247 and in the sense amplifier 247, data that is stored in the aforementioned memory cell is judged as "1."

In this manner, by reading a resistance-divided potential in accordance with the resistance value of the memory element 241, data that is stored in the memory cell can be judged.

According to the aforementioned method, data is read with a voltage value by utilizing resistance division and a disparity in resistance values of the memory element 241. However, data stored in the memory element 241 may be read with a current value.

Note that this embodiment mode can be carried out by freely combining it with the aforementioned embodiment mode.

The memory device of this embodiment mode is capable of recording and erasing data by applying voltage to a pair of conductive layers. Therefore, it is possible to write and erase data at a time other than during manufacturing by selectively heating an arbitrary memory element. Also, since there is no need to provide a separate device for writing and erasing data, the memory device can be downsized and simplified. Further, by forming a memory element using a substrate having a flexible property, a memory device having a flexible property can be manufactured.

Embodiment Mode 4

In this embodiment mode, one example of a semiconductor device including the memory device described in the above embodiment mode is described using drawings.

The semiconductor device that is described in this embodiment mode is characterized in that reading and writing of data is possible without contact. Transmission formats of data are roughly classified into three types, which are: electromagnetic coupling type which carries out communication through mutual induction by positioning a pair of coils so as to face each other; electromagnetic induction type which carries out communication through an induction field; and electric wave type which carries out communication by utilizing electric waves. Any type may be used.

One structural example of a case of a semiconductor device in which an antenna is provided over a substrate, over which a plurality of elements and memory elements are provided, is described with reference to FIGS. 9A and 9B.

Figure 9A:
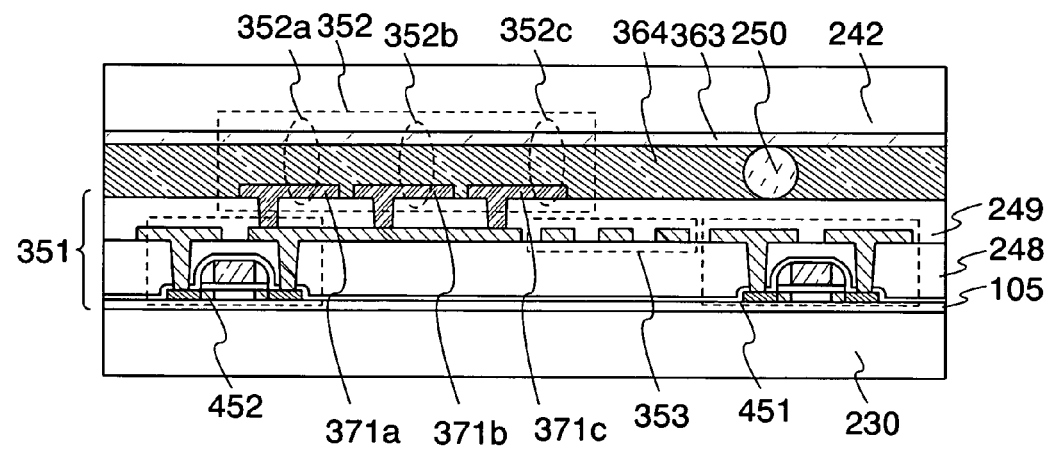
FIGS. 9A and 9B are each cross sectional views describing a semiconductor device of the present invention.

FIG. 9A shows a semiconductor device including a memory circuit that is formed as a passive matrix type. The semiconductor device is formed with an element forming layer 351 including transistors 451 and 452 that are formed over the first substrate 230, the insulating layer 249 covering the transistors, first conductive layers 371*a* to 371*c* of a memory element formed over the insulating layer 249 and are connected to the transistor 452, and a conductive layer 353 functioning as an antenna; a second conductive layer 363 that is formed adjacently to the second substrate 242; and an organic compound layer 364 interposed between the first conductive layers 371*a* to 371*c*, and the second conductive layer 363. Also, the memory element is formed with the first conductive layers 371*a* to 371*c*, the second conductive layer 363, and the organic compound layer 364 sandwiched by the first conductive layers 371*a* to 371*c* and the second conductive layer 363. Further, the spacer 250 may be provided between the insulating layer 249 and the second conductive layer 363.

Note that the transistor 451 forms any of a power source circuit, a clock generating circuit, a data demodulation/modulation circuit, a control circuit, or an interface circuit; and the transistor 452 controls the potentials of the first conductive layers 371*a* to 371*c* of the memory element.

The conductive layer 353 functioning as an antenna is formed with the same layer as a source wire and a drain wire of the transistor. Note that it is not limited to this structure, and the conductive layer 353 functioning as an antenna may be formed as a layer under or over the transistor. In this case, as a material for the conductive layer 353 functioning as an antenna, one type of element selected from gold, (Au), platinum (Pt), nickel (Ni), tungsten (W), molybdenum (Mo), cobalt (Co), copper (Cu), aluminum (Al), manganese (Mn), titanium (Ti) and the like; or an alloy or the like including a plurality of the elements can be used. Also, as a formation method of the conductive layer 353 functioning as an antenna, a droplet discharging method, various printing methods such as evaporation, sputtering, a CVD method, screen printing, or gravure printing, or the like can be used.

A memory element portion 352 includes a plurality of memory elements 352*a* to 352*c*. Also, the memory element 352*a* includes the first conductive layer 371*a* formed over the insulating layer 249, the organic compound layer 364, and the second conductive layer 363 formed over the second substrate 242. Further, the memory element 352*b* includes the first conductive layer 371*b* formed over the insulating layer 249, the organic compound layer 364, and the second conductive layer 363 formed over the second substrate 242. Furthermore, the memory element 352*c* includes the first conductive layer 371*c* formed over the insulating layer 249, the organic compound layer 364, and the second conductive layer 363 formed over the second substrate 242. The first conductive layers 371*a* to 371*c* are connected to a source wire or a drain wire of the transistor 452.

Further, the memory element portion 352 can be formed by appropriately using a similar structure, material, and manufacturing method to those of the memory element described in the aforementioned embodiment mode.

In the memory element portion 352, as shown in the aforementioned embodiment mode, an element having a rectifying property may be provided between the first conductive layers 371a to 371c and the organic compound layer 364, or between the organic compound layer 364 and the second conductive layer 363. For the element having a rectifying property, the one mentioned above in Embodiment Mode 1 can be used.

For the transistors 451 and 452 included in the element forming layer 351, the transistor 240 described in Embodiment Mode 3 can be appropriately used.

Also, a separation layer and the element forming layer 351 may be formed over the first substrate 230, and then the element forming layer 351 may be separated by appropriately using the separation method described in Embodiment Mode 3, and attached to a substrate using an adhesion layer. For the first substrate, by using the flexible substrate, the film including a resin layer showing thermoplasticity, or the like as shown by the first substrate 31 in Embodiment Mode 1, reduction in size, thickness, and weight of a memory device is possible.

Further, a sensor connecting to the transistor may be provided. As the sensor, an element which detects temperature, humidity, illuminance, gas, gravity, pressure, sound (vibration), or acceleration by a physical or chemical means is given. The sensor is typically formed by a semiconductor element such as a resistance element, a capacitive coupling element, an inductive coupling element, a photovoltaic element, a photoelectric conversion element, a thermo-electromotive force element, a transistor, a thermistor, or a diode.

Figure 9B:
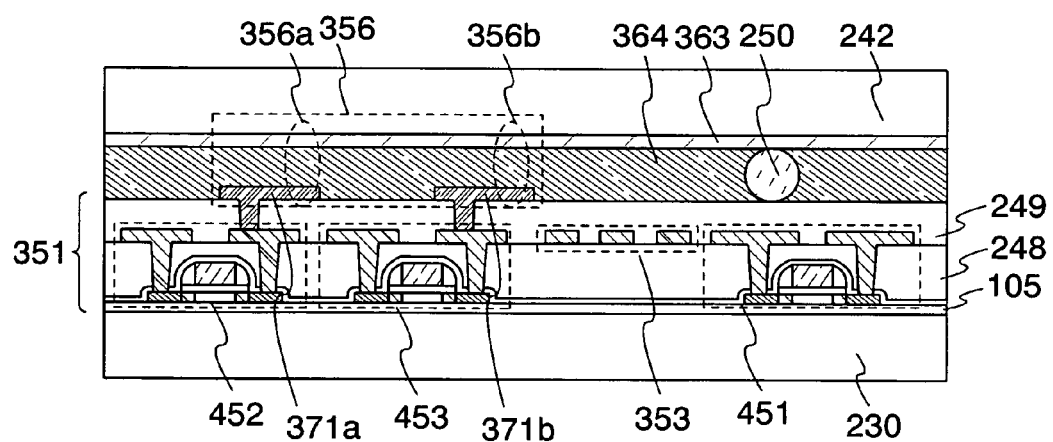

FIG. 9B shows an example of a semiconductor device including an active matrix type memory circuit. Note that for FIG. 9B, portions that are different from FIG. 9A are described.

The semiconductor device shown in FIG. 9B is formed with an element forming layer 351 including transistors 451 to 453 formed over the first substrate 230, the insulating layer 249 covering the transistors, the first conductive layer 371a of a memory element 356a connected to the transistor 452 and the first conductive layer 371b of a memory element 356b connected to the transistor 453 which are formed over the insulating layer 249, the insulating layer 249 covering the transistors 451 to 453, and the conductive layer 353 functioning as an antenna; the second conductive layer 363 formed adjacently to the second substrate 242; and the organic compound layer 364 interposed between the first conductive layers 371a and 371b, and the second conductive layer 363. The memory element portion 356 is formed with the memory element 356a and a memory element 356b. The memory element 356a is formed with the first conductive layer 371a, the second conductive layer 363, and the organic compound layer 364 interposed between the first conductive layer 371a and the second conductive layer 363. The memory element 356b is formed with the first conductive layer 371b, the second conductive layer 363, and the organic compound layer 364 interposed between the first conductive layer 371b and the second conductive layer 363. Also, the spacer 250 may be provided between the insulating layer 249 and the second conductive layer 363.

Note that the first conductive layer 371a and the first conductive layer 371b are each connected to a source wire or a drain wire of the transistors. In other words, a transistor is provided for every memory element.

Further, the memory elements 356a and 356b can be formed by appropriately using the structure, material and manufacturing method described in the aforementioned embodiment mode. Also, in the memory elements 356a and 356b, as mentioned above, an element having a rectifying property may be provided between the first conductive layers 371a and 371b, and the organic compound layer 364, or between the organic compound layer 364 and the second conductive layer 363.

A separation layer and the element forming layer 351 may be formed over the first substrate 230, and then the element forming layer 351 may be separated by appropriately using the separation method described in Embodiment Mode 3, and attached to a substrate having a flexible property using an adhesion layer.

Note that a sensor that connects to a transistor may be provided. As the sensor, an element which detects temperature, humidity, illuminance, gas, gravity, pressure, sound (vibration), or acceleration by a physical or chemical means is given. The sensor is typically formed by a semiconductor element such as a resistance element, a capacitive coupling element, an inductive coupling element, a photovoltaic element, a photoelectric conversion element, a thermo-electromotive force element, a transistor, a thermistor, or a diode.

Note that the present embodiment mode can be carried out by freely combining it with the aforementioned embodiment mode.

By the present embodiment mode, providing a more inexpensive semiconductor device is possible. Further, by forming a memory element using a substrate having a flexible property, a semiconductor device having a flexible property can be manufactured.

Embodiment 1

Figure 12A:
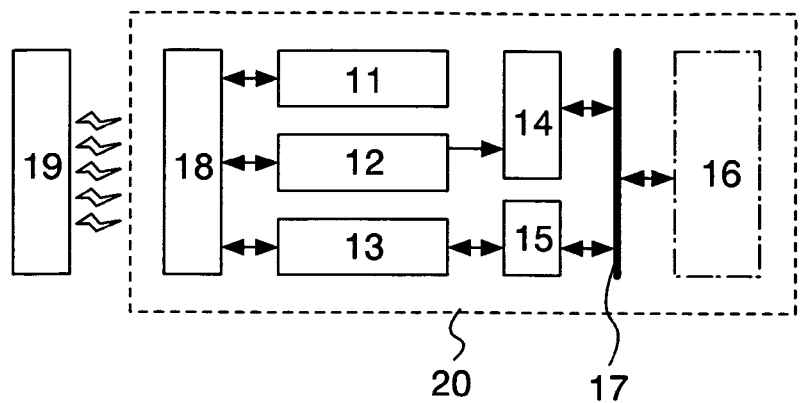
FIGS. 12A to 12C each describe a structural example of a semiconductor device of the present invention.

Here, a structure for a semiconductor device of the present invention is described with reference to FIGS. 12A to 12C. As shown in FIG. 12A, a semiconductor device 20 of the present invention has a function of communicating without contact, and has a power source circuit 11, a clock generating circuit 12, a data demodulation/modulation circuit 13, a control circuit 14 which controls another circuit, an interface circuit 15, the memory device 16, a bus 17, and an antenna 18.

Figure 12B:
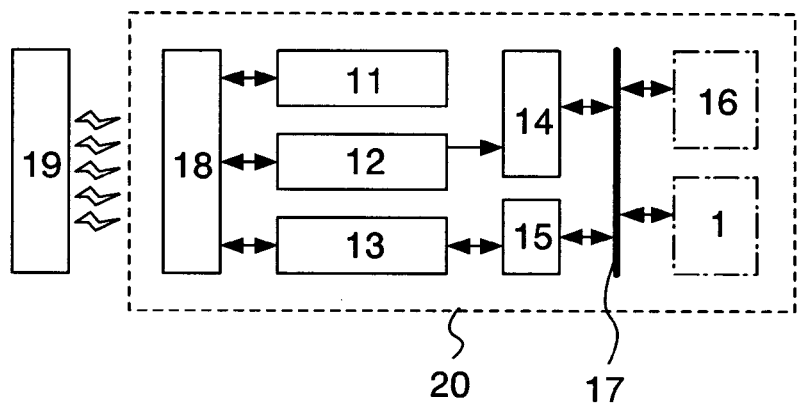

Also, as shown in FIG. 12B, the semiconductor 20 of the present invention has the function of communicating without contact, and may also have a central processing unit 1, in addition to the power source circuit 11, the clock generating circuit 12, the data demodulation/modulation circuit 13, the control circuit 14 which controls another circuit, the interface circuit 15, the memory device 16, the bus 17, and the antenna 18.

Figure 12C:
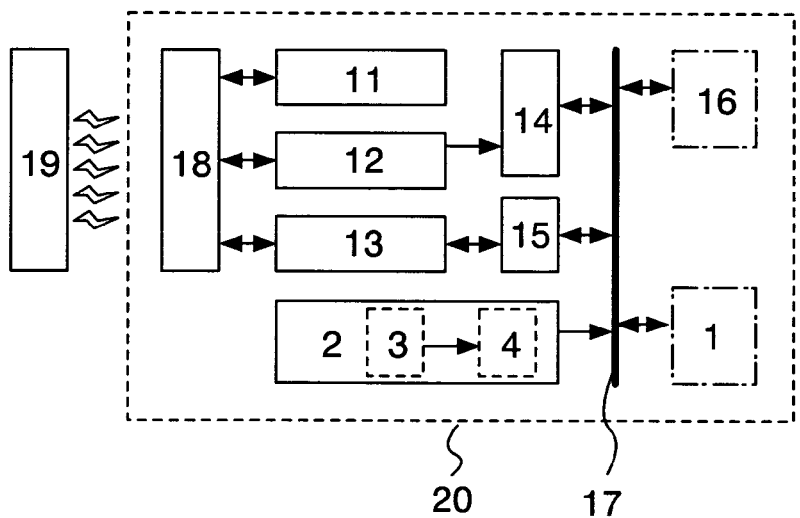

Further, as shown in FIG. 12C, the semiconductor 20 of the present invention has the function of communicating without contact, and may also have a detection portion 2 including a detection element 3 and a detection control circuit 4, in addition to the power source circuit 11, the clock generating circuit 12, the data demodulation/modulation circuit 13, the control circuit 14 which controls another circuit, the interface circuit 15, the memory device 16, the bus 17, the antenna 18, and the central processing unit 1.

The semiconductor device of the present embodiment mode, by a transistor in a element forming layer, through forming the detection portion 2 including the detection element 3 and the detection control circuit 4, in addition to the power source circuit 11, the clock generating circuit 12, the data demodulation/modulation circuit 13, the control circuit 14 which controls another circuit, the interface circuit 15, the memory device 16, the bus 17, the antenna 18, and the central processing unit 1, a semiconductor device that is downsized and has a sensing function, which is capable of transmitting/receiving electric waves can be formed.

The power source circuit 11 is a circuit which generates electrical power that is to be distributed to each circuit inside the semiconductor device 20, based on an alternating signal that is inputted from the antenna 18. The clock generating circuit 12 is a circuit which generates various clock signals that are to be distributed to each circuit inside the semiconductor device 20, based on an alternating signal that is inputted from the antenna 18. The data demodulation/modulation circuit 13 has a function of demodulating/modulating data that is communicated to/from a reader/writer 19. The control circuit 14 has a function of controlling the memory device 16. The antenna 18 has a function of carrying out transmission/reception of electromagnetic waves. The reader/writer 19 controls communication with the semiconductor device and a process relating to data thereof. Note that the semiconductor device is not restricted to the aforementioned structure, and for example, the structure may be that of adding other components such as a limiter circuit of power source voltage or hardware only for processing codes.

The memory device 16 has one or a plurality of memory elements selected from those described in Embodiment Modes 1 to 3. Since the memory element including an organic compound layer can simultaneously realize reduction in size and thickness as well as increase in capacity, by providing the memory element including an organic compound layer for the memory device 16, reduction in size and weight of the semiconductor device can be achieved.

The detection portion 2 can detect temperature, pressure, flow rate, light, magnetism, sound (vibration), acceleration, humidity, illuminance, gas component, fluid component, and other characteristics by a physical or chemical means. Also, the detection portion 2 includes the detection element 3 which detects a physical amount or a chemical amount, and the detection control circuit 4 which converts the physical amount or the chemical amount detected by the detection element 3 into an appropriate signal such as an electrical signal. The detection element 3 can be formed by such an element as a resistance element, a capacitive coupling element, an inductive coupling element, a photovoltaic element, a photoelectric conversion element, a thermo-electromotive force element, a transistor, a thermistor, a diode, electrostatic capacitance element, or a piezo element. Note that a plurality of detection portions 2 may be provided, and in such a case, a plurality of physical amounts or chemical amounts can be detected simultaneously.

Further, the physical amount mentioned here refers to temperature, pressure, flow rate, light, magnetism, sound (vibration), acceleration, humidity, illuminance and the like, and the chemical amount refers to a chemical substance and the like such as a gas component, and a liquid component like ions. As the chemical amount, other organic compounds such as specific biological materials and the like included in blood, sweat, urine and the like (for example, blood glucose level and the like) are also included. In particular, since in a case where a chemical amount is to be detected, naturally a particular substance is to be selectively detected, a substance which selectively reacts with the substance to be detected is provided in the detection element 3 in advance. For example, in a case of detecting a biological material, it is preferable to provide an enzyme, an antibody molecule, a microbial cell, or the like that selectively reacts with the biological substance that is to be detected by the detection element 3, by fixing it on a high molecular compound or the like.

Embodiment 2

Figure 13A:
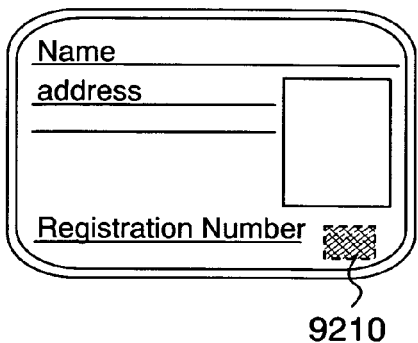
FIGS. 13A to 13F each describe a usage of a semiconductor device of the present invention.
Figure 13B:
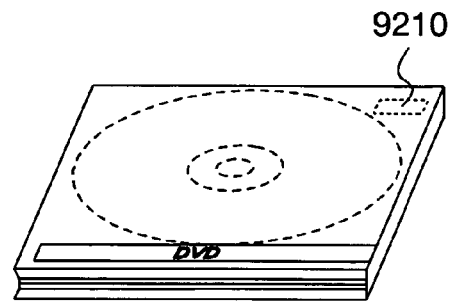
Figure 13C:
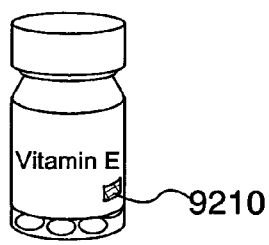
Figure 13D:
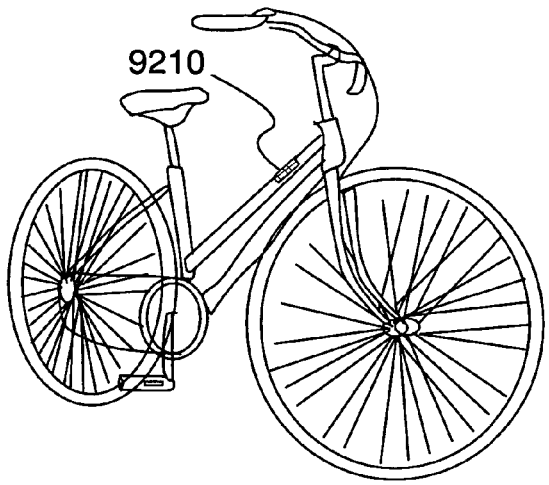
Figure 13E:
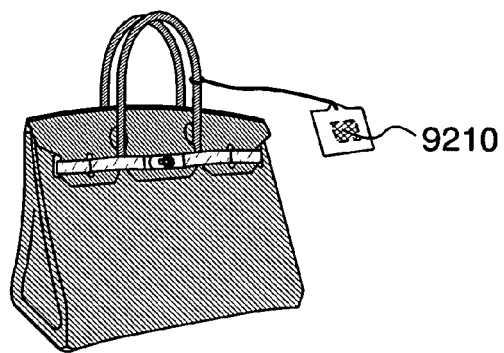
Figure 13F:
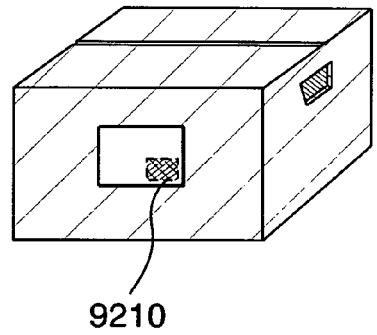

By the present invention, a semiconductor device 9210 functioning as a wireless chip can be formed. The use of a wireless chip is extensive. For example, the semiconductor device 9210 can be used by providing it on items such as bills, coins, securities, bearer bonds, certificates (such as a driver's license or a residence certificate; see FIG. 13A), recording media (such as DVD software or a videotape; see FIG. 13B), packaging cases (package paper or bottles; see FIG. 13C), vehicles (such as a bicycle; see FIG. 13D), personal belongings (such as shoes or eyeglasses), food items, plants, clothing, livingware, commodities such as electrical appliances, and baggage tags for baggage (see FIGS. 13E and 13F). The semiconductor device 9210 can also be provided on animals and on human bodies. The electrical appliances refer to a liquid crystal display device, an EL display device, a television device (also simply called a TV, a TV receiver, or a television receiver), a cellular phone and the like.

The semiconductor device 9210 of the present invention is fixed on an item by mounting it on a printed-circuit board, affixing it on a surface of the item, or by embedding it into the item, etc. For example, the semiconductor device 9210 is fixed on a book by embedding it in paper, or it is fixed on a packaging case made of an organic resin, by embedding it in the organic resin. Because the semiconductor device 9210 of the present invention realizes compactness in size, thinness, and lightness in weight, it does not detract from the design of an item itself after it is fixed on the item. Also, by providing the semiconductor device 9210 of the present invention on bills, coins, securities, bearer bonds, certificates and the like, an authentication function can be provided, and by utilizing this authentication function, counterfeiting can be prevented. Furthermore, by providing the semiconductor device of the present invention on packaging cases, recording media, personal belongings, food items, clothing, livingware, electronic appliances and the like, improvement in efficiency for inspection systems and the like can be achieved.

Figure 14:
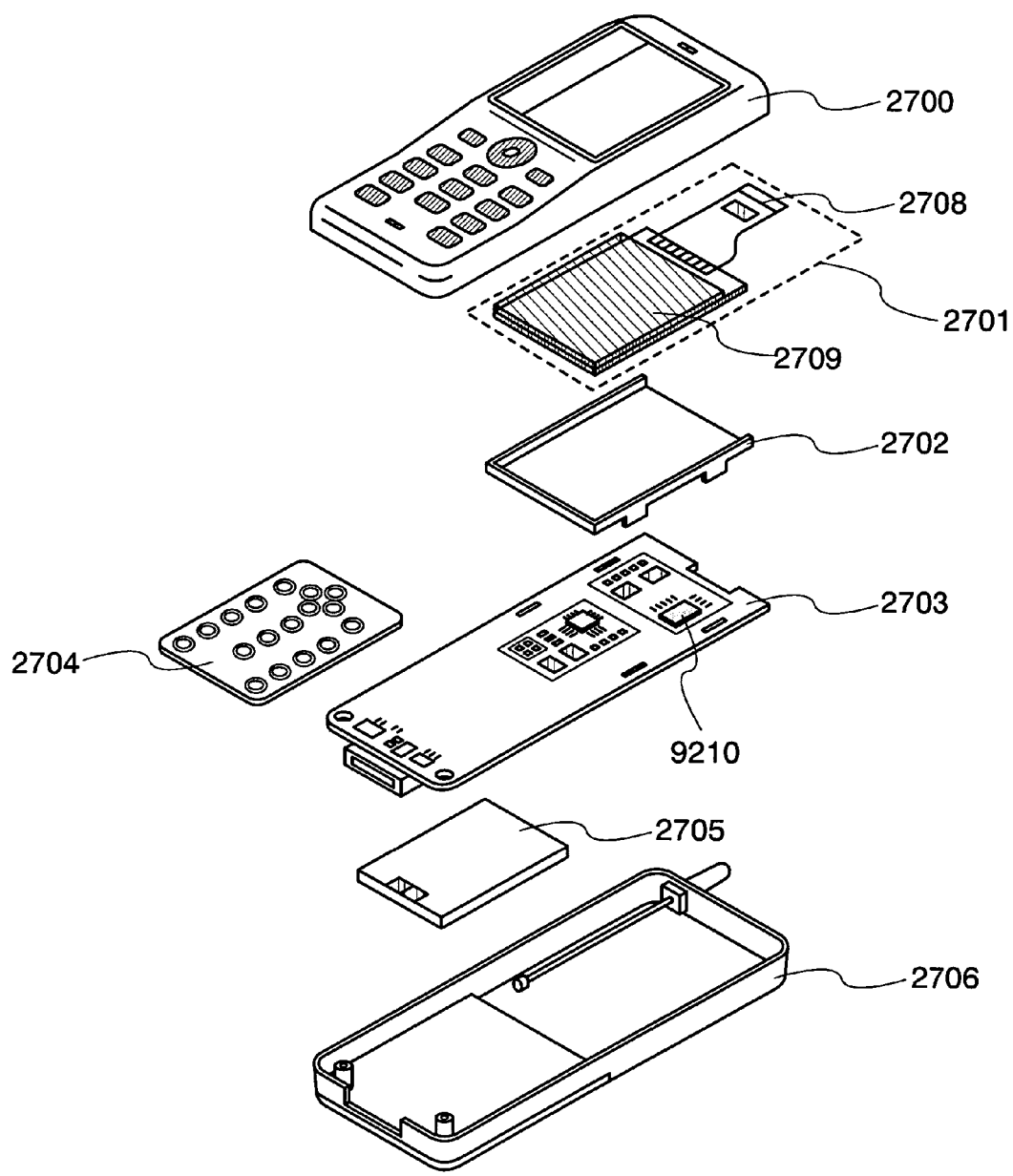
FIG. 14 describes an electronic apparatus including a semiconductor of the present invention.

One mode of an electronic appliance which the semiconductor device 9210 of the present invention is mounted on is explained with reference to drawings. An example here shows a cellular phone which has casings 2700 and 2706; a panel 2701; a housing 2702; a printed wiring board 2703; an operation button 2704; and a battery 2705 (see FIG. 14). The panel 2701 is detachably incorporated in the housing 2702, and the housing 2702 is fitted to the printed wiring board 2703. The form and size of the housing 2702 is appropriately changed depending on an electronic appliance which the panel 2701 is to be incorporated into. On the printed wiring board 2703, a plurality of packaged semiconductor devices are mounted, and as one of these, the semiconductor device 9210 of the present invention can be used. The semiconductor device of the present invention that is mounted on the printed wiring board 2703 has a plurality of functions of a controller, a central processing unit (CPU), a memory, a power source circuit, an audio processing circuit, a transmission/reception circuit and the like.

The panel 2701 is connected to the printed wiring board 2703 via a connection film 2708. The aforementioned panel 2701, housing 2702, and printed wiring board 2703 are enclosed inside of the casings 2700 and 2706, along with the operation button 2704 and battery 2705. A pixel region 2709 that is included in the panel 2701 is located so that it is visible from an open window that is provided for the casing 2700.

Note that for the casings 2700 and 2706, an exterior appearance form of the cellular phone is shown as an example; however, an electrical appliance according to this embodiment can transform into various modes depending on its function or use.

As in the above, the semiconductor device of the present invention is characterized by compactness in size, thinness, and lightness in weight. By these characteristics, limited space in the interior of the casings 2700 and 2706 of an electrical appliance can be utilized effectively. Furthermore, the electrical appliance can be downsized.

Embodiment 3

Figure 16:
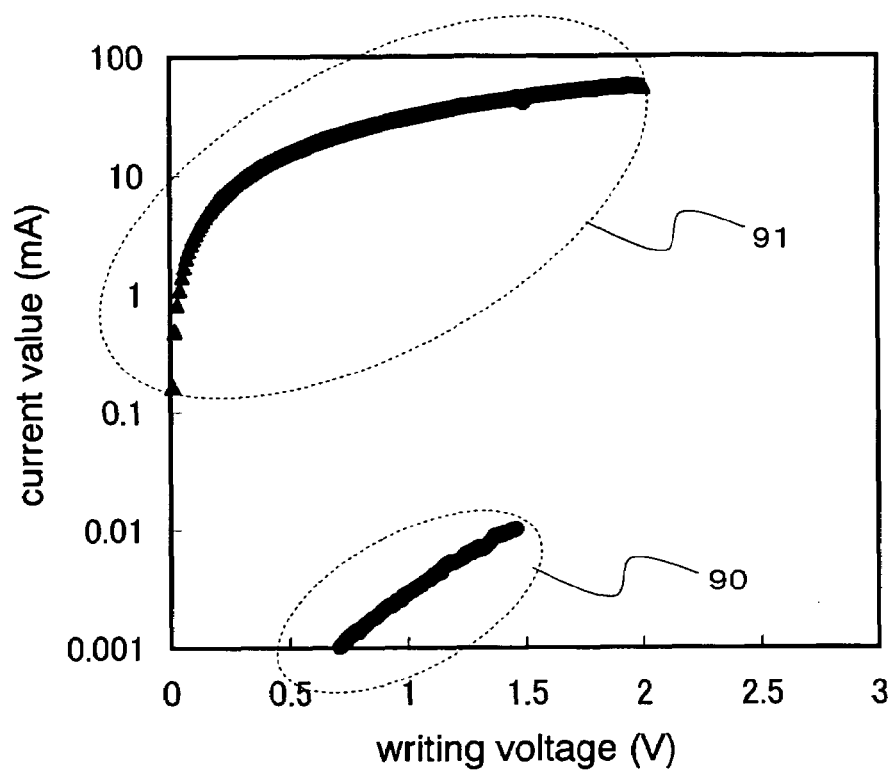
FIG. 16 describes a current-voltage characteristic of a memory element of the present invention during writing.

In this embodiment, a voltage-current characteristic of when data is written by applying voltage to a memory element of the present invention is described in FIG. 16.

A sample that is manufactured in this embodiment includes a memory element that is structured by forming an insulating layer over a substrate, forming a first conductive layer over the insulating layer, forming an organic compound layer over the first conductive layer, and forming a second conductive layer over the organic compound layer.

In this embodiment, a glass substrate is used for a substrate; a titanium layer with a thickness of 100 nm formed by a sputtering method is used for the first conductive layer; 4-cyano-4'-n-octyloxybiphenyl with a thickness of 100 nm formed by an evaporation method is used for the organic compound layer; and an aluminum layer with a thickness of 200 nm formed by an evaporation method is used for the second conductive layer. Also, a top surface form of an overlap of the first conductive layer and the second conductive layer of the memory element is square, and the length of a single side is 10 μm. As a writing method at this time, a sweep measuring is carried out for which voltage is raised every 0.01 V from 0 V and the current value of the sample is measured at each voltage. Further, the time of application for each voltage is 100 msec.

A writing characteristic of the sample used in this embodiment is shown in FIG. 16. The horizontal axis is the writing voltage, and the vertical axis represents the writing current value. A plot surrounded by a dotted line 90 shows a current value of the memory element against an applied voltage prior to writing, and a plot surrounded by a dotted line 91 shows a current value of the memory element against the applied voltage after writing. It is apparent that writing is possible at about 1.5 V. In other words, since writing is possible with a low voltage, a semiconductor device including the memory element described in this embodiment can reduce power consumption. Also, since writing is possible with a low voltage, in a semiconductor device capable of transmitting/receiving information wirelessly such as an RFID tag, data writing, erasing, and rewriting are possible even with electrical power that is generated based on an alternating signal inputted from an antenna.

Embodiment 4

Figure 17:
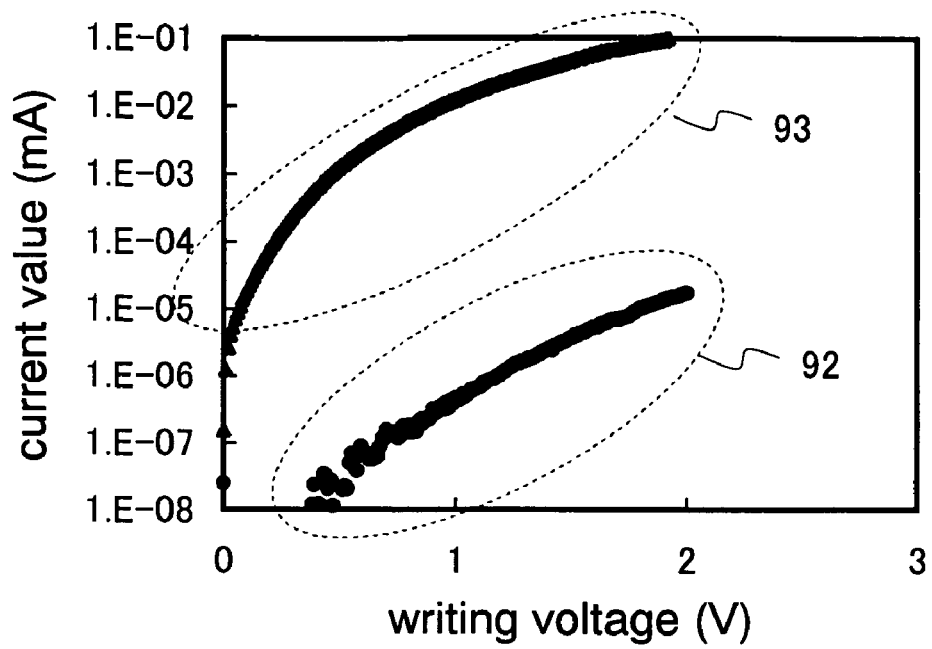
FIG. 17 describes a current-voltage characteristic of a memory element of the present invention during writing.

In this embodiment, a voltage-current characteristic of when data is written by applying voltage to a memory element of the present invention is described in FIG. 17.

A sample that is manufactured in this embodiment includes a memory element that is structured by forming an insulating layer over a substrate, forming a first conductive layer over the insulating layer, forming an organic compound layer over the first conductive layer, and forming a second conductive layer over the organic compound layer.

In this embodiment, a glass substrate is used for the substrate; a titanium layer with a thickness of 100 nm formed by a sputtering method is used for the first conductive layer; 4-cyanophenyl-4'-n-octyloxyphenyl benzoate with a thickness of 100 nm formed by an evaporation method is used for the organic compound layer; and an aluminum layer with a thickness of 200 nm formed by an evaporation method is used for the second conductive layer. Also, a top surface form of an overlap of the first conductive layer and the second conductive layer of the memory element is square, and the length of a single side is 10 μm. As a writing method at this time, a sweep measuring is carried out for which voltage is raised every 0.01 V from 0 V and the current value of the sample at each voltage is measured. Further, the time of application for each voltage is 100 msec.

A writing characteristic of the sample used in this embodiment is shown in FIG. 17. The horizontal axis is the writing voltage, and the vertical axis represents the writing current value. A plot surrounded by a dotted line 92 shows a current value of the memory element against an applied voltage prior to writing, and a plot surrounded by a dotted line 93 shows a current value of the memory element against the applied voltage after writing. It is apparent that writing is possible at about 2 V. In other words, since writing is possible with a low voltage, a semiconductor device including the memory element described in this embodiment can reduce power consumption. Also, since writing is possible with a low voltage, in a semiconductor device capable of transmitting/receiving information wirelessly typified by a wireless chip, data writing, erasing, and rewriting is possible even with electrical power that is generated based on an alternating signal inputted from an antenna.

The present application is based on Japanese Patent Application serial No. 2005-132816 filed on Apr. 28, 2005 in Japanese Patent Office, the entire contents of which are hereby incorporated by reference.

What is claimed is:

1. A memory device comprising:
    a memory element,
    wherein the memory element comprises a pair of conductive layers and an organic compound interposed between the pair of conductive layers,
    wherein the organic compound has a liquid crystal property, and
    wherein data is recorded by applying a voltage to the pair of conductive layers and heating the organic compound to cause a phase change of the organic compound from a first phase to a second phase.

2. The memory device according to claim 1,
    wherein the organic compound is in an isotropic phase within a first temperature range, in a smectic phase within a second temperature range, and in a crystal phase within a third temperature range,
    wherein the first temperature range is higher than the second temperature range, and
    wherein the second temperature range is higher than the third temperature range.

3. The memory device according to claim 1, wherein the voltage is applied to the pair of conductive layers, after heating the organic compound to be in the first phase and then rapidly cooling the organic compound.

4. The memory device according to claim 1, wherein the first phase is an isotropic phase and the second phase is a smectic phase.

5. The memory device according to claim 1, wherein the first phase is an isotropic phase and the second phase is a crystal phase.

6. The memory device according to claim 1, wherein the first phase is a smectic phase and the second phase is a crystal phase.

7. The memory device according to claim 1, wherein the first phase is a crystal phase and the second phase is a smectic phase.

8. The memory device according to claim 1, wherein the first phase is a crystal phase and the second phase is an isotropic phase.

9. The memory device according to claim 1, wherein the first phase is a smectic phase and the second phase is an isotropic phase.

10. A semiconductor device having the memory device according to claim 1.

11. The semiconductor device according to claim 10, further comprising a conductive layer functioning as an antenna, a first transistor connected to at least one of the pair of conductive layers and a second transistor connected to the conductive layer functioning as an antenna.

12. A memory device comprising:
a memory cell array in which memory elements are arranged in a matrix form; and
a writing circuit,
wherein each of the memory elements has a pair of conductive layers and an organic compound interposed between the pair of conductive layers,
wherein the organic compound has a liquid crystal property,
wherein data is recorded by applying a first voltage to the pair of conductive layers and heating the organic compound to cause a phase change of the organic compound from a first phase to a second phase, and
wherein the first voltage is applied by the writing circuit.

13. The memory device according to claim 12, further comprising an erasing circuit,
wherein the data is erased by applying a second voltage to the pair of conductive layers and heating the organic compound to cause a phase change of the organic compound from the second phase to the first phase, and
wherein the second voltage is applied by the erasing circuit.

14. The memory device according to claim 12, further comprising an erasing circuit,
wherein the data is erased by applying a second voltage to the pair of conductive layers and heating the organic compound and then stopping the heating and cooling the organic compound, to cause a phase change of the organic compound from the second phase to the first phase, and
wherein the second voltage is applied by the erasing circuit.

15. The memory device according to claim 12,
wherein the organic compound is in an isotropic phase within a first temperature range, in a smectic phase within a second temperature range, and in a crystal phase within a third temperature range,
wherein the first temperature range is higher than the second temperature range, and
wherein the second temperature range is higher than the third temperature range.

16. The memory device according to claim 12, wherein the first voltage is applied to the pair of conductive layers, after heating the organic compound to be in the first phase and then rapidly cooling the organic compound.

17. The memory device according to claim 12, wherein the first phase is an isotropic phase and the second phase is a smectic phase.

18. The memory device according to claim 12, wherein the first phase is an isotropic phase and the second phase is a crystal phase.

19. The memory device according to claim 12, wherein the first phase is a smectic phase and the second phase is a crystal phase.

20. The memory device according to claim 12, wherein the first phase is a crystal phase and the second phase is a smectic phase.

21. The memory device according to claim 12, wherein the first phase is a crystal phase and the second phase is an isotropic phase.

22. The memory device according to claim 12, wherein the first phase is a smectic phase and the second phase is an isotropic phase.

23. A semiconductor device having the memory device according to claim 12.

24. The semiconductor device according to claim 23, further comprising a conductive layer functioning as an antenna, a first transistor connected to at least one of the pair of conductive layers and a second transistor connected to the conductive layer functioning as an antenna.

25. A memory device comprising:
a memory cell array in which memory cells are arranged in a matrix form; and
a writing circuit,
wherein each of the memory cells has a transistor and a memory element,
wherein the memory element has a pair of conductive layers and an organic compound interposed between the pair of conductive layers,
wherein the organic compound has a liquid crystal property,
wherein data is recorded by applying a first voltage to the pair of conductive layers and heating the organic compound to cause a phase change of the organic compound from a first phase to a second phase, and
wherein the first voltage is applied by the writing circuit.

26. The memory device according to claim 25, further comprising an erasing circuit,
wherein the data is erased by applying a second voltage to the pair of conductive layers and heating the organic compound to cause a phase change of the organic compound from the second phase to the first phase, and
wherein the second voltage is applied by the erasing circuit.

27. The memory device according to claim 25, further comprising an erasing circuit,
wherein the data is erased by applying a second voltage to the pair of conductive layers and heating the organic compound and then stopping the heating and cooling the organic compound, to cause a phase change of the organic compound from the second phase to the first phase, and
wherein the second voltage is applied by the erasing circuit.

28. The memory device according to claim 25,
wherein the organic compound is in an isotropic phase within a first temperature range, in a smectic phase within a second temperature range, and in a crystal phase within a third temperature range,
wherein the first temperature range is higher than the second temperature range, and
wherein the second temperature range is higher than the third temperature range.

29. The memory device according to claim 25, wherein the first voltage is applied to the pair of conductive layers, after heating the organic compound to be in the first phase and then rapidly cooling the organic compound.

30. The memory device according to claim 25, wherein the first phase is an isotropic phase and the second phase is a smectic phase.

31. The memory device according to claim 25, wherein the first phase is an isotropic phase and the second phase is a crystal phase.

32. The memory device according to claim 25, wherein the first phase is a smectic phase and the second phase is a crystal phase.

33. The memory device according to claim 25, wherein the first phase is a crystal phase and the second phase is a smectic phase.

34. The memory device according to claim 25, wherein the first phase is a crystal phase and the second phase is an isotropic phase.

35. The memory device according to claim 25, wherein the first phase is a smectic phase and the second phase is an isotropic phase.

36. A semiconductor device having the memory device according to claim 25.

37. The semiconductor device according to claim 36, further comprising a conductive layer functioning as an antenna, a first transistor connected to at least one of the pair of conductive layers and a second transistor connected to the conductive layer functioning as an antenna.

38. A method of driving a memory device comprising a memory element including a pair of conductive layers and an organic compound interposed between the pair of conductive layers, the method comprising:
applying a voltage to the pair of conductive layers to heat the organic compound; and
recording data by a phase change of the organic compound from a first phase to a second phase by applying the voltage,
wherein the organic compound has a liquid crystal property.

39. The method according to claim 38,
wherein the organic compound is in an isotropic phase within a first temperature range, in a smectic phase within a second temperature range, and in a crystal phase within a third temperature range,
wherein the first temperature range is higher than the second temperature range, and
wherein the second temperature range is higher than the third temperature range.

40. The method according to claim 38, wherein the first phase is an isotropic phase and the second phase is a smectic phase.

41. The method according to claim 38, wherein the first phase is an isotropic phase and the second phase is a crystal phase.

42. The method according to claim 38, wherein the first phase is a smectic phase and the second phase is a crystal phase.

43. The method according to claim 38, wherein the first phase is a crystal phase and the second phase is a smectic phase.

44. The method according to claim 38, wherein the first phase is a crystal phase and the second phase is an isotropic phase.

45. The method according to claim 38, wherein the first phase is a smectic phase and the second phase is an isotropic phase.

46. A method of driving a memory device comprising a memory element including a pair of conductive layers and an organic compound interposed between the pair of conductive layers, the method comprising:
applying a first voltage to the pair of conductive layers to heat the organic compound to be in a first phase;
cooling the organic compound so that the organic compound is fixed in the first phase;
applying a second voltage to the pair of conductive layers to heat the organic compound to be in a second phase;
recording data by a phase change of the organic compound from the first phase to the second phase;
applying a third voltage to the pair of conductive layers to heat the organic compound to be in the first phase; and
erasing the data by a phase change of the organic compound from the second phase to the first phase,
wherein the organic compound has a liquid crystal property.

47. The method according to claim 46,
wherein the organic compound is in an isotropic phase within a first temperature range, in a smectic phase within a second temperature range, and in a crystal phase within a third temperature range,
wherein the first temperature range is higher than the second temperature range, and
wherein the second temperature range is higher than the third temperature range.

48. The method according to claim 46, wherein the first phase is an isotropic phase and the second phase is a smectic phase.

49. The method according to claim 46, wherein the first phase is an isotropic phase and the second phase is a crystal phase.

50. The method according to claim 46, wherein the first phase is a smectic phase and the second phase is a crystal phase.

51. A method of driving a memory device comprising a memory element including a pair of conductive layers and an organic compound interposed between the pair of conductive layers, the method comprising:
applying a first voltage to the pair of conductive layers to heat the organic compound that is in a first phase to be in a second phase;
cooling the organic compound so that the organic compound is fixed in the second phase;
recording data by a phase change of the organic compound from the first phase to the second phase;
applying a second voltage to the pair of conductive layers to heat the organic compound to heighten a fluid property of the organic compound;
stopping the heating and cooling the organic compound to be fixed in the first phase; and
erasing the data by a phase change of the organic compound from the second phase to the first phase,
wherein the organic compound has a liquid crystal property.

52. The method according to claim 51,
wherein the organic compound is in an isotropic phase within a first temperature range, in a smectic phase within a second temperature range, and in a crystal phase within a third temperature range,
wherein the first temperature range is higher than the second temperature range, and
wherein the second temperature range is higher than the third temperature range.

53. The method according to claim 51, wherein the first phase is a crystal phase and the second phase is a smectic phase.

54. The method according to claim 51, wherein the first phase is a crystal phase and the second phase is an isotropic phase.

55. The method according to claim 51, wherein the first phase is a smectic phase and the second phase is an isotropic phase.

* * * * *